(12) United States Patent
Mihara

(10) Patent No.: US 11,264,244 B2
(45) Date of Patent: Mar. 1, 2022

(54) METHOD OF MANUFACTURING SEMICONDUCTOR DEVICE

(71) Applicant: RENESAS ELECTRONICS CORPORATION, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 7 days.

(21) Appl. No.: 16/793,573

(22) Filed: Feb. 18, 2020

(65) Prior Publication Data

US 2021/0257217 A1   Aug. 19, 2021

(51) Int. Cl.

| | |
|---|---|
| *H01L 21/285* | (2006.01) |
| *H01L 27/12* | (2006.01) |
| *H01L 29/45* | (2006.01) |
| *H01L 29/78* | (2006.01) |
| *H01L 29/66* | (2006.01) |
| *H01L 21/84* | (2006.01) |
| *H01L 21/311* | (2006.01) |
| *H01L 21/762* | (2006.01) |
| *H01L 21/768* | (2006.01) |

(52) U.S. Cl.
CPC .. *H01L 21/28518* (2013.01); *H01L 21/31111* (2013.01); *H01L 21/31116* (2013.01); *H01L 21/76243* (2013.01); *H01L 21/76805* (2013.01); *H01L 21/76895* (2013.01); *H01L 21/84* (2013.01); *H01L 27/1203* (2013.01); *H01L 29/45* (2013.01); *H01L 29/66492* (2013.01); *H01L 29/66537* (2013.01); *H01L 29/7833* (2013.01)

(58) Field of Classification Search
CPC ......... H01L 21/76895; H01L 21/76805; H01L 29/66598; H01L 29/7834; H01L 29/66628
See application file for complete search history.

(56) References Cited

U.S. PATENT DOCUMENTS 9,935,125 B2    4/2018 Tsunomura et al.
2013/0175606 A1*  7/2013 Cheng .................. H01L 27/0883
                                                              257/329

(Continued)

FOREIGN PATENT DOCUMENTS

JP         2013-219181 A       10/2013

*Primary Examiner* — Moazzam Hossain
*Assistant Examiner* — Stanetta D Isaac
(74) *Attorney, Agent, or Firm* — McDermott Will & Emery LLP

(57) ABSTRACT

After a MISFET is formed on a substrate including a semiconductor substrate, an insulating layer and a semiconductor layer, an interlayer insulating film and a first insulating film are formed on the substrate. Also, after an opening is formed in each of the first insulating film and the interlayer insulating film, a second insulating film is formed at each of a bottom portion of the opening and a side surface of the opening and also formed on an upper surface of the first insulating film. Further, each of the second insulating film formed at the bottom portion of the opening and the second insulating film formed on the upper surface of the first insulating film is removed by etching. After that, an inside of the opening is etched under a condition that each of the first insulating film and the second insulating film is less etched than the insulating layer.

15 Claims, 28 Drawing Sheets

(56) References Cited

U.S. PATENT DOCUMENTS

2013/0264644 A1\* 10/2013 Tsunomura ......... H01L 27/1203
257/350
2016/0071799 A1\* 3/2016 Hsieh ................ H01L 21/28518
257/288

\* cited by examiner

METHOD OF MANUFACTURING SEMICONDUCTOR DEVICE

BACKGROUND

The present invention relates to a method of manufacturing a semiconductor device, and the present invention can be suitably applied to a method of manufacturing a semiconductor device using, for example, a SOI substrate.

In order to manufacture a semiconductor device, after a semiconductor element such as MISFET (Metal Insulator Semiconductor Field Effect Transistor) is formed on a semiconductor substrate, a multi-layer wiring structure including a plurality of interlayer insulating films and a plurality of wiring layers is formed on the semiconductor substrate. There is a technique using a SOI substrate as a semiconductor substrate.

There is disclosed technique listed below.
[Patent Document 1] Japanese Unexamined Patent Application Publication No. 2013-219181.
Patent Document 1 discloses a technique relating to a semiconductor device using a SOI substrate.

SUMMARY

It is desirable to improve a reliability of a semiconductor device manufactured by using the SOI substrate. It is also desirable to reduce a manufacturing cost of a semiconductor device manufactured by using the SOI substrate.

Other objects and novel features will become apparent from the description of this specification and the accompanying drawings.

According to one embodiment, a method of manufacturing a semiconductor device, comprises the steps of: (a) providing a substrate including a semiconductor substrate, an insulating layer formed on the semiconductor substrate, a semiconductor layer formed on the insulating layer, and a gate electrode formed on the semiconductor layer via a gate insulating film. Also, the method comprises: (b) after the step (a), forming an epitaxial layer on the semiconductor layer located at both sides of the gate electrode by an epitaxial growth method. Also, the method comprises: (c) after the step (b), forming a metal silicide layer in the epitaxial layer by silicidation of the epitaxial layer. Also, the method comprises: (d) after the step (c), forming an interlayer insulating film on the substrate so as to cover the gate electrode and the metal silicide layer. Also, the method comprises: (e) after the step (d), forming a first insulating film on the interlayer insulating film. Also, the method comprises: (f) after the step (e), forming an opening at a portion of each of the first insulating film and the interlayer insulating film, which is overlapping with the metal silicide layer. Also, the method comprises: (g) after the step (f), forming a second insulating film at each of a bottom portion of the opening and a side surface of the opening, and on an upper surface of the first insulating film. Also, the method comprises: (h) after the step (g), removing each of the second insulating film formed at the bottom portion of the opening and the second insulating film formed on the upper surface of the first insulating film by etching. Also, the method comprises: (i) after the step (h), etching inside of the opening in such a state that an upper surface of the interlayer insulating film is covered with the first insulating film, and in such a state that the side surface of the opening, which is a side surface of the interlayer insulating film, is covered with the second insulating film. Also, the method comprises: (j) after the step (i), forming a plug comprised of a conductive material inside of the opening. Further, the step (i) is performed under a condition that each of the first insulating film, the second insulating film and the metal silicide layer is less etched than the insulating layer.

DETAILED DESCRIPTION

Figure 1:
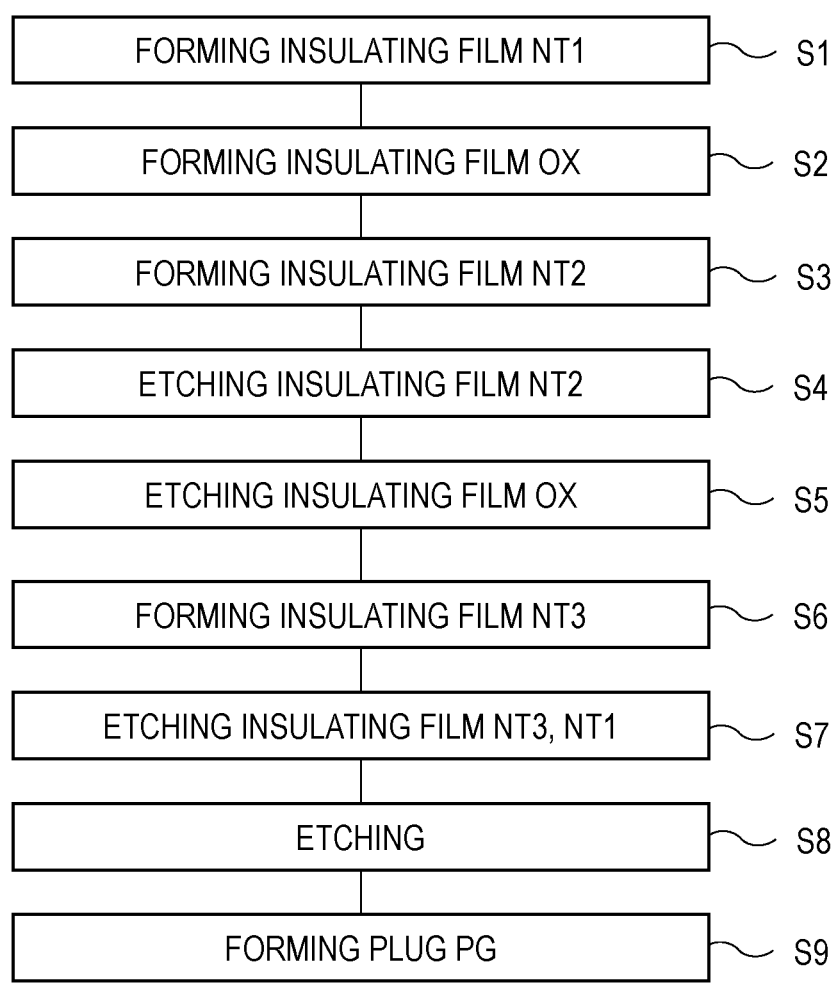
FIG. 1 is a process flow diagram showing a part of a manufacturing process of a semiconductor device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The embodiments would be explained below in detail based on each drawing. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

First Embodiment

<Manufacturing Process of Semiconductor Device>

A manufacturing process of a semiconductor device of the present first embodiment will be explained referring to the drawings. FIG. 1 is a process flow diagram showing a part of a manufacturing process of a semiconductor device according to the present first embodiment. FIG. 2 to FIG. 21 are a cross-section view during the manufacturing process of the semiconductor device according to the present first embodiment. FIG. 1 is a process flow diagram of the steps shown in FIGS. 13 to 19.

Figure 2:
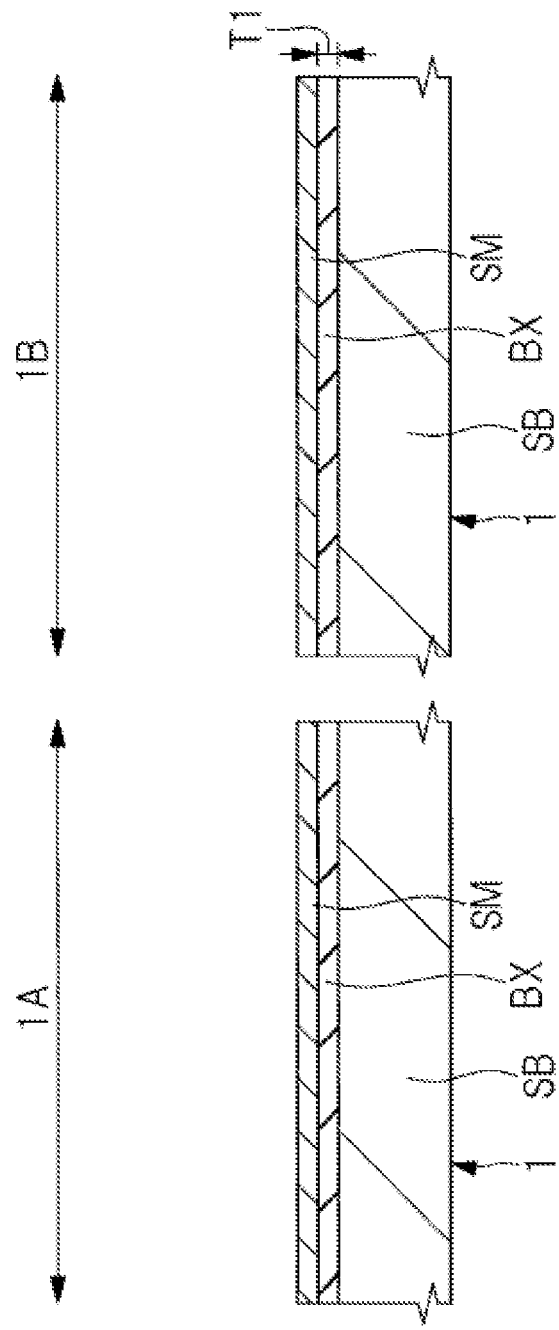
FIG. 2 is a cross-section view during the manufacturing process of the semiconductor device according to one embodiment.

First, as shown in FIG. 2, an SOI (SOI: Silicon On Insulator) substrate 1 is prepared (provided).

The SOI substrate 1 has a semiconductor substrate SB as a support substrate, an insulating layer (buried insulating film) BX formed on a main surface of the semiconductor substrate SB, and a semiconducting layer SM formed on an upper surface of the insulating layer BX.

The semiconductor substrate SB is a support substrate supporting the insulating layer BX and structures above the insulating layer BX, but is also a semiconductor substrate. The semiconductor substrate SB is preferably monocrystalline silicon substrate and comprised, for example, of p-type monocrystalline silicon. For example, the semiconductor substrate SB can be formed from monocrystalline silicon having a resistivity of about 1 Ωcm to 10 Ωcm. The thickness of semiconductor substrate SB may be, for example, about 700 μm to 1000 μm. The insulating layer BX is preferably a silicon oxide film, and the thickness of the insulating layer BX can be, for example, about 10 nm to 30 nm. When the insulating layer BX is a silicon oxide film, the insulating layer BX can be regarded as a BOX (Buried Oxide) layer. The semiconductor layer SM is made of monocrystalline silicon or the like. For example, the semiconductor layer SM can be formed of a monocrystalline silicon having a resistivity of about 1 Ωcm to 10 Ωcm. The thickness of the semiconductor layer SM is thinner than the thickness of semiconductor substrate SB which is the support substrate, and the thickness of the semiconductor layer SM can be, for example, about 20 nm to 50 nm. SOI substrate 1 is formed by semiconductor substrate SB, the insulating layer BX, and the semiconducting layer SM.

In SOI substrate 1, the main surface of the main surface of semiconductor substrate SB that is in contact with the insulating layer BX is referred to as upper surface of semiconductor substrate SB, and the main surface of semiconductor substrate SB that is opposed to upper surface is referred to as the back surface of semiconductor substrate SB. In SOI substrate 1, the main surface of the main surface of the insulating layer BX on the side in contact with semiconductor substrate SB is referred to as the lower surface of the insulating layer BX, the main surface of the semiconductor layer SM on the side in contact with the semiconductor layer SM is referred to as upper surface of the insulating layer BX, and upper surface and the lower surface of the insulating layer BX are mutually opposed surfaces. The main surface of the main surface of the semiconductor layer SM on the side in contact with the insulating layer BX is referred to as a lower surface of the semiconductor layer SM, and the main surface of the semiconductor layer SM on the side opposed to the lower surface thereof is referred to as an upper surface of the semiconductor layer SM.

The SOI substrate 1 can be manufactured by using, for example, a SIMOX (Separation by Implantation of Oxygen method, a lamination method, or a smart cut process, although manufacturing method of SOI substrate 1 is not limited thereto.

Figure 3:
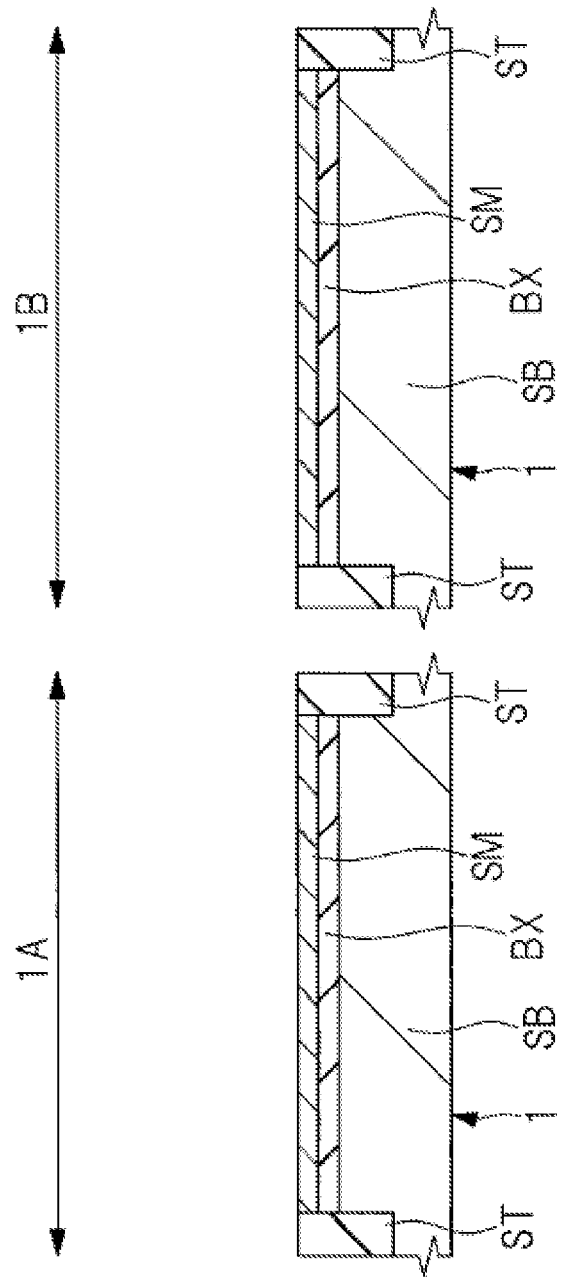
FIG. 3 is a cross-section view during the manufacturing process of the semiconductor device following FIG. 2.

Next, as shown in FIG. 3, an element isolation region ST is formed. The element isolation region ST penetrates through the semiconductor layer SM and the insulating layer BX so as to reach the semiconductor substrate SB, and the bottom surface of the element isolation region ST is located in the middle of the thickness of semiconductor substrate SB. That is, the height position of the bottom surface of the isolation regions ST is lower than the height position of the bottom surface of the insulating layer BX (the interface between the insulating layer BX and semiconductor substrate SB).

The isolation regions ST can be formed by Shallow Trench Isolation method, for example, as follows. That is, a photoresist pattern (not shown) is formed on upper surface of the semiconductor layer SM using a photolithography technique, and then the semiconductor layer SM, the insulating layer BX, and semiconductor substrate SB are etched using the photoresist pattern as an etching mask, thereby forming device isolation trenches TRs. The trench TR may be formed by using an insulating film formed over the semiconductor layer SM as an etching mask. The trench TR penetrates through the semiconductor layer SM and the insulating layer BX, the bottom surface of the trench TR reaches semiconductor substrate SB, and the bottom surface of the trench TR is positioned in the middle of the thickness of semiconductor substrate SB. Then, an insulating film (silicon oxide film) for forming the element isolation region ST is formed on SOI substrate 1 so as to fill the inside of the trench TR, and then the insulating film (insulating film for forming the element isolation region ST) outside the trench TR is removed by using a CMP (Chemical Mechanical Polishing: Chemical Mechanical Polishing) method or the like. As a result, the element isolation region ST made of an insulating film, preferably a silicon oxide film, buried in the trench TR can be formed. In the stage where SOI substrate 1 is prepared, the semiconductor layer SM is formed on the entire surface of upper surface of semiconductor substrate SB via the insulating layer BX, but when the element isolation region ST is formed, the semiconductor layer SM is partitioned into a plurality of regions (active regions) each surrounded by the element isolation region ST.

Next, a photoresist pattern (not shown) formed on SOI substrate 1 can be used as a mask (an ion implantation blocking mask) to perform ion implantation for adjusting the threshold of semiconductor substrate SB of SOI substrate 1. The ion implantation is performed to control the threshold voltages of MISFET formed later on the semiconductor layer SM. By this ion implantation, in semiconductor substrate SB, an impurity is introduced into a region adjoining the insulating layer BX to form a semiconductor region.

Next, a semiconductor device such as a MISFET is formed on the semiconductor layer SM.

By forming the element isolation region ST, the semiconductor layer SM is partitioned into a plurality of regions (active regions) surrounded by the element isolation region ST in plan view, and a MISFET is formed in the semiconductor layer SM of the active regions. The semiconductor layer SM of each active region is surrounded by the element isolation region ST in a plan view, and its lower surface is adjacent to the insulating layer BX. Therefore, the semiconductor layer SM of each active region is surrounded by the element isolation region ST and the insulating layer BX.

The process of forming MISFET will be described in detail below.

First, after the surface of the semiconductor layer SM is cleaned by performing a cleaning process (wet etching process for cleaning) as necessary, a gate insulating film GF is formed on the surface of the semiconductor layer SM. The gate insulating film GF is formed of a silicon oxide film or the like, and can be formed by a thermal oxidation method or the like.

Figure 4:
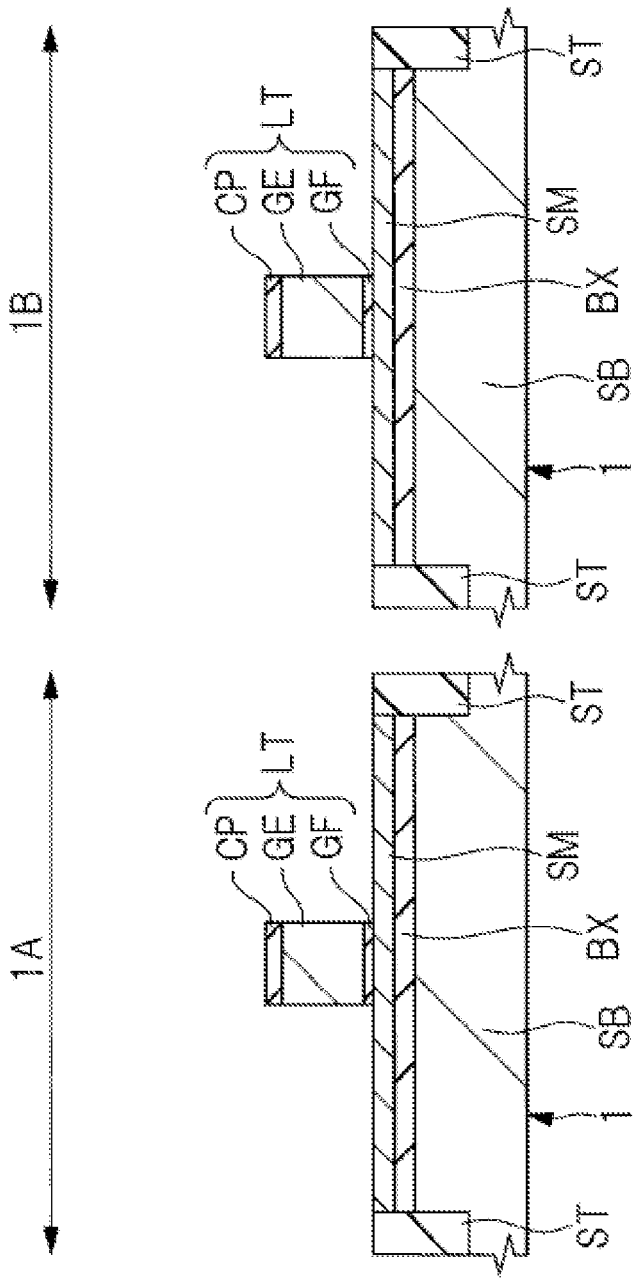
FIG. 4 is a cross-section view during the manufacturing process of the semiconductor device following FIG. 3.

Next, a silicon film such as a doped polysilicon film is formed on the main surface of the SOI substrate 1, that is, on the gate insulating film GF and the isolation regions ST, as a conductive film for forming a gate electrodes GE. Also, an insulating film such as a silicon nitride film (an insulating film for forming a cap insulating film CP) is formed on the silicon film. Then, the stacked film of the silicon film and the insulating film thereon is patterned by photolithography and dry etching to form the gate electrode GE and the cap insulating film CP thereon. The gate electrode GE is formed on the semiconductor layer SM via the gate insulating film GF. The cap insulating film CP has substantially the same planar shape as the gate electrode GE. The portion of the gate insulating film GF not covered with the gate electrode GE can be removed by dry etching when patterning the silicon film or wet etching thereafter. This step is illustrated in FIG. 4.

Here, the laminated structure of the gate electrode GE and the cap insulating film CP thereon, and referred to below as the laminate LT.

Figure 5:
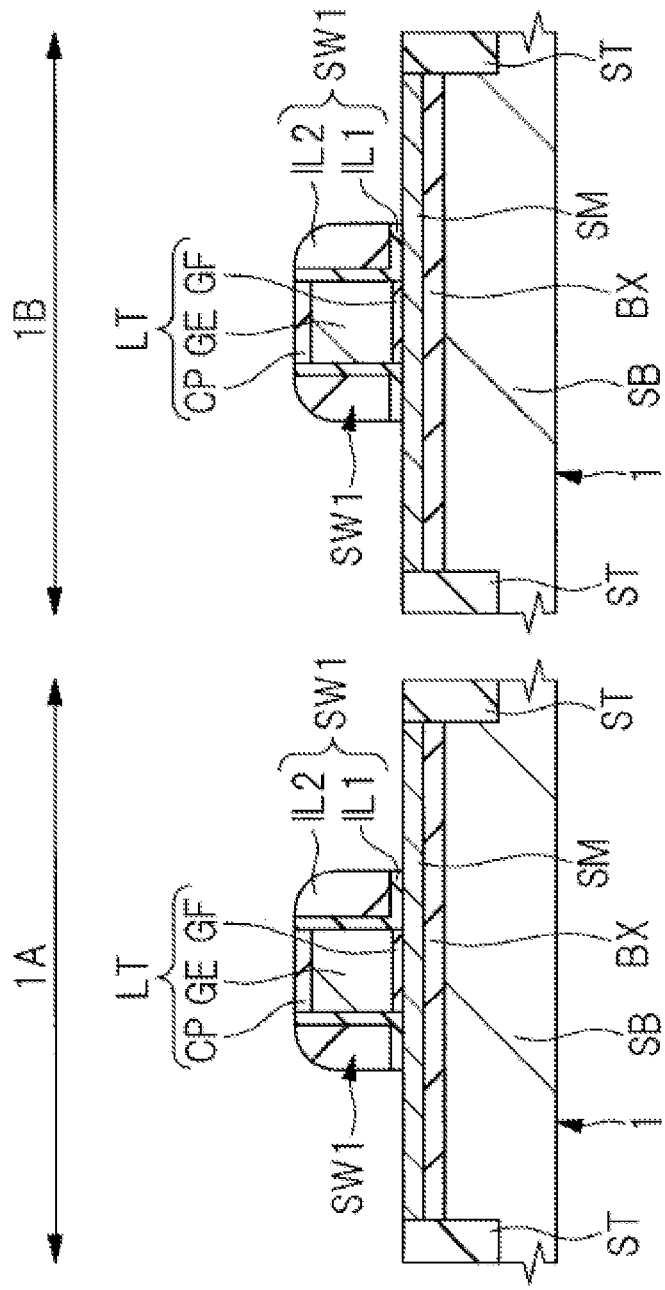
FIG. 5 is a cross-section view during the manufacturing process of the semiconductor device following FIG. 4.

Next, as shown in FIG. 5, a sidewall spacer SW1 is formed as a sidewall insulating film on the side surface of the stacked body LT. The sidewall spacer SW1 forming step can be performed as follows.

First, a multilayer film comprised of an insulating film IL1 and an insulating film IL2 on the insulating film IL1 is formed on the entire main surface of SOI substrate 1 including the isolation regions ST so as to cover the multilayer body LT. The insulating film IL1 and the insulating film IL2 are made of different materials, preferably, the insulating film IL1 is made of a silicon oxide film, and the insulating film IL2 is made of a silicon nitride film. Then, the stacked film of the insulating film IL1 and the insulating film IL2 is etched back by an anisotropic etching technique to form the sidewall spacers SW1 on both side surfaces of the stacked body LT. This step is illustrated in FIG. 5. The sidewall spacer SW1 is formed of a laminated film of an insulating film IL1 and an insulating film IL2.

Figure 6:
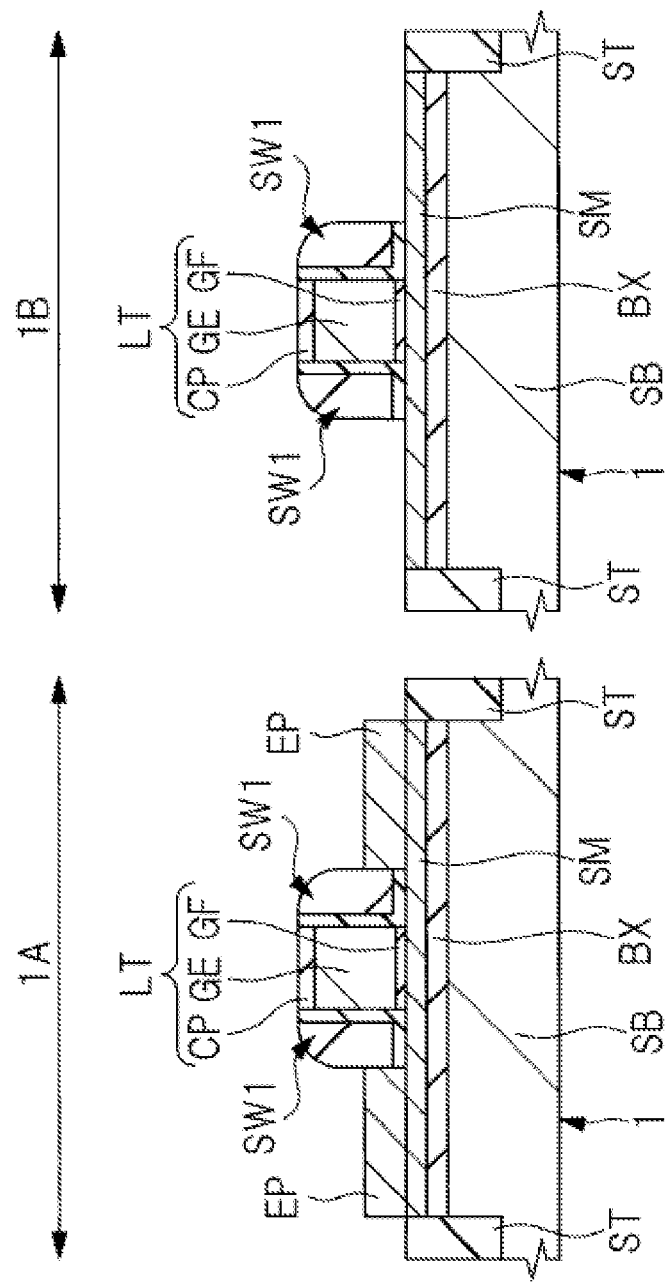
FIG. 6 is a cross-section view during the manufacturing process of the semiconductor device following FIG. 5.

Next, as shown in FIG. 6, a semiconductor layer EP is formed on the semiconductor layer SM of the SOI substrate 1 by epitaxial growth method. The semiconducting layer EP is an epitaxial layer formed by epitaxial growth method, and is made of monocrystalline silicon, for example. Since the semiconductor layer EP is formed by epitaxial growth method, the crystal structure of the semiconductor layer EP reflects the crystal structure of the underlying semiconductor layer SM, and the crystal structure of the semiconductor layer EP is the same as the crystal structure of the semiconductor layer SM. The thickness of the semiconductor layer EP may be, for example, about 20 nm to 50 nm.

Since the semiconductor layer EP is formed by epitaxial growth method, the epitaxial layer (semiconductor layer EP) is selectively grown on the exposed surface (Si surface) of the semiconductor layer SM, and the epitaxial layer is not grown on the insulating film. Therefore, the semiconductor layer EP is selectively grown on the exposed surface of the semiconductor layer SM that is not covered with the stacked body LT and the sidewall spacer SW1. Therefore, as shown in the area 1A of FIG. 6, the semiconductor layer EP (epitaxial layer) is formed on the semiconductor layer SM located at both sides of the structural body comprised of the stacked body LT and the sidewall spacers SW1 on the semiconductor layer SM. Since an upper surface of the gate electrode GE is covered with the cap insulating film CP and the side surface of the gate electrode GE is covered with the sidewall spacer SW1, the epitaxial layer EP is not formed on the gate electrode GE. Further, since the element isolation region ST is made of an insulator (insulating film), an epitaxial layer (semiconductor layer EP) is not formed on the element isolation region ST.

Here, when forming the semiconductor layer EP by epitaxial growth, the epitaxial layer EP may not be successfully formed on the semiconductor layer SM. The region 1A of FIG. 6 shows a case where the epitaxial layer (semiconductor layer EP) is successfully formed on the semiconductor layer SM, and the region 1B of FIG. 6 shows a case where the epitaxial layer (semiconductor layer EP) is not successfully formed on the semiconductor layer SM. Therefore, although the structure of the region 1A and the structure of the region 1B are the same in FIGS. 1 to 5, the epitaxial layer (semiconductor layer EP) is formed on the semiconductor layer SM in the region 1A of FIG. 6, whereas the epitaxial layer (semiconductor layer EP) is not formed on the semiconductor layer S in the region 1B of FIG. 6.

Originally, however, the manufacturing process is controlled so that the epitaxial layer EP is formed on the semiconductor layer SM as in the region 1A. Therefore, ideally, when the epitaxial growth process is performed, a structure such as a region 1A is obtained, and a structure such as a region 1B is not generated. However, due to various causes, the epitaxial layer EP is not successfully formed on the semiconductor layer S, and structures such as regions 1B may occur. At the stage of performing the epitaxial growth process, it cannot be confirmed whether or not a structure such as the region 1B has occurred, and therefore, the following steps are the same regardless of whether or not a structure of the region 1B has occurred.

Figure 7:
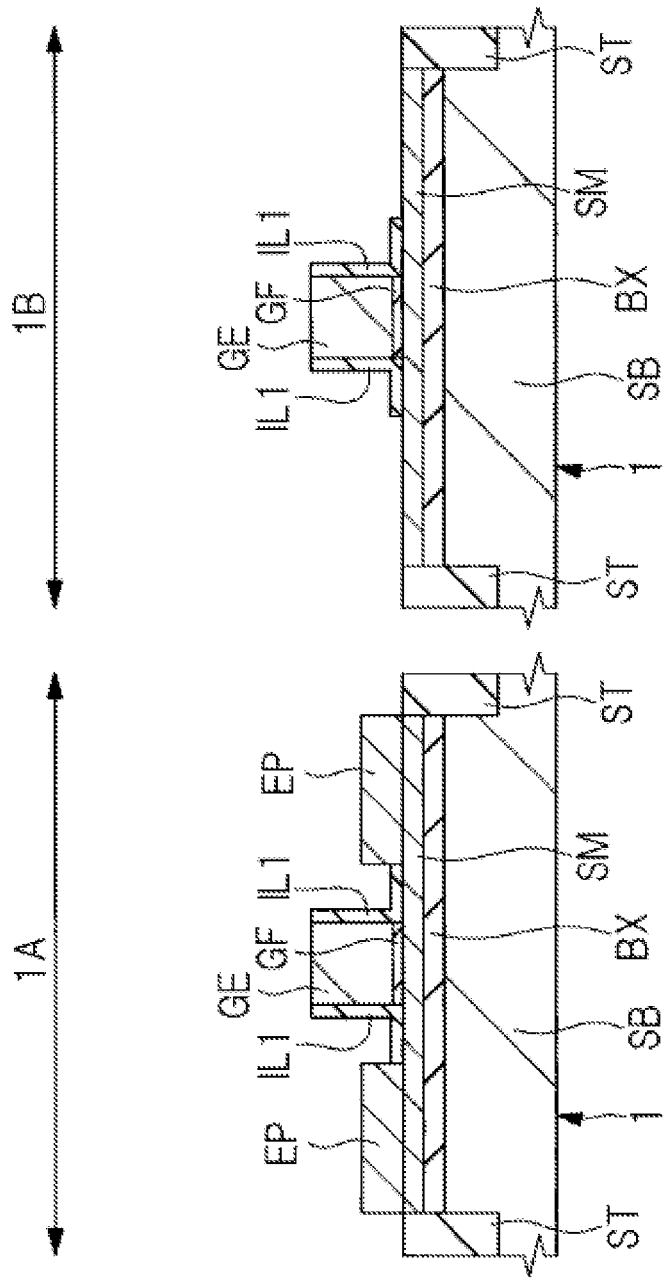
FIG. 7 is a cross-section view during the manufacturing process of the semiconductor device following FIG. 6.

Next, as shown in FIG. 7, the insulating film IL2 constituting the sidewall spacer SW1 is etched away. At this time, since the insulating film IL2 is etched and removed under a condition that the insulating film IL1 is less etched than the insulating film IL2, the insulating film IL1 constituting the sidewall spacer SW1 is hardly etched and remains. In addition, since the insulating film IL2 is formed of the same materials as the cap insulating film CP, the cap insulating film CP can also be removed by etching at this time. If the cap insulating film CP is removed, a metal silicide layer SL to be described later can be formed on the gate electrode GE.

Figure 8:
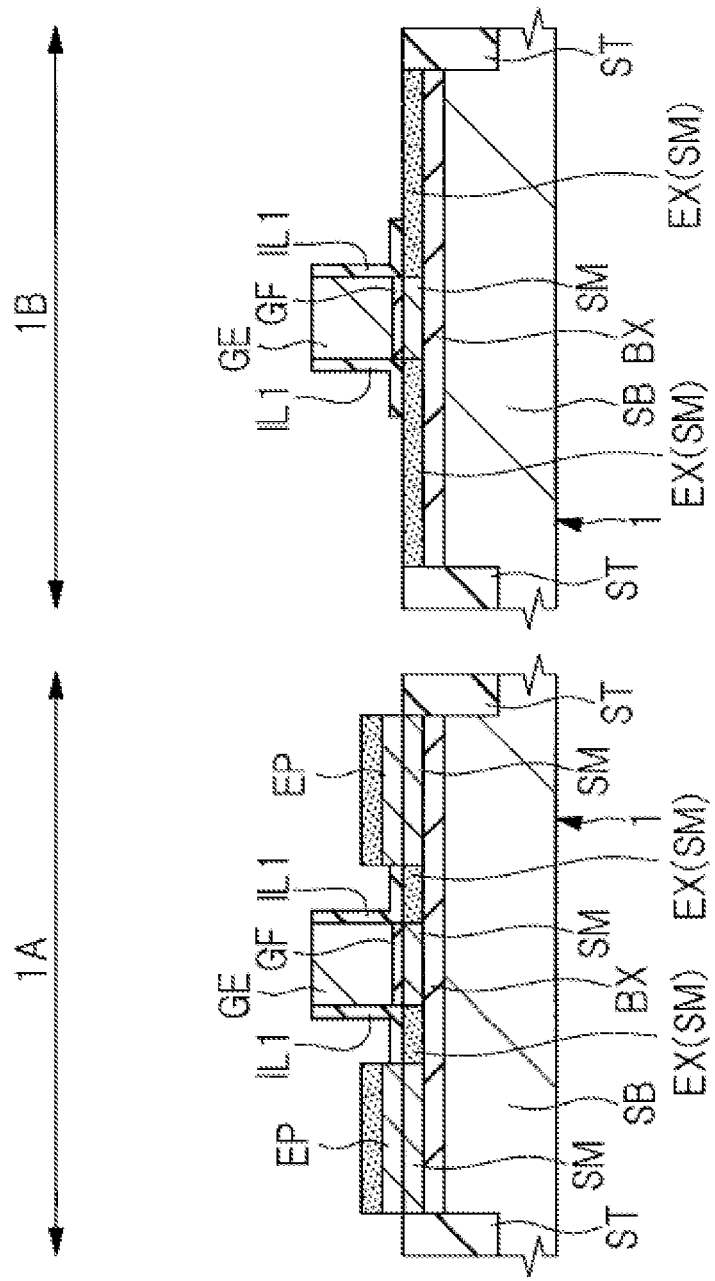
FIG. 8 is a cross-section view during the manufacturing process of the semiconductor device following FIG. 7.

Next, as shown in FIG. 8, n-type impurities such as phosphorus (P) or arsenic (As) are ion-implanted into regions on both sides of the gate electrodes GE in the semiconductor layers SM and EP of SOI substrate 1, thereby forming n− type semiconductor regions (extension regions) EX. In the ion implantation for forming n− semiconductor region EX, the gate electrode GE and the insulating film IL1 extending on the side surface of the gate electrode GE can function as ion implantation blocking masks. In FIG. 8, a region into which an impurity is implanted by ion implantation at this time is shown by hatching dots.

Figure 9:
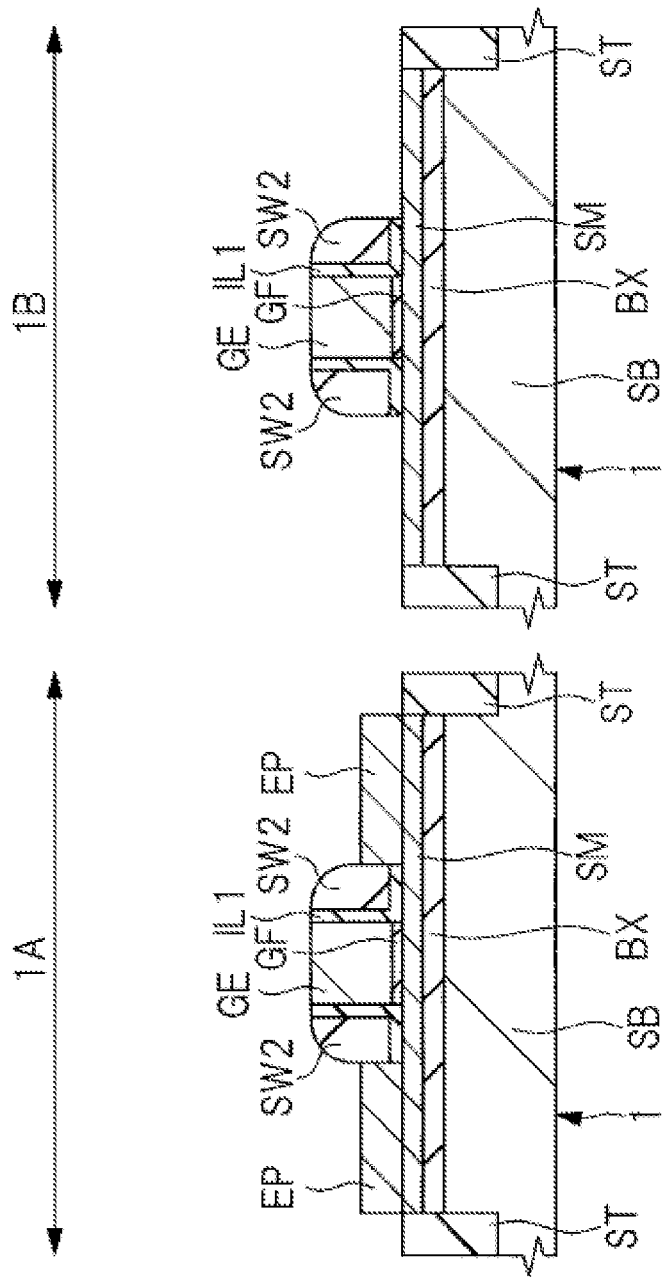
FIG. 9 is a cross-section view during the manufacturing process of the semiconductor device following FIG. 8.

Next, as shown in FIG. 9, sidewall spacers SW2 are formed as sidewall insulating films on the side surfaces of the gate electrodes GE.

The sidewall spacer SW2 forming step can be performed as follows. That is, an insulating film for forming a sidewall spacer SW2, for example, a silicon nitride film, is formed on the entire main surface of SOI substrate 1 including the isolation regions ST so as to cover the gate electrode GE and the insulating film IL1, and then this insulating film is etched back by an anisotropic etching technique, whereby the sidewall spacer SW2 can be formed on the side surface of the gate electrode GE. The sidewall spacers SW2 are formed on both side surfaces of the gate electrode GE with an insulating film IL1 interposed therebetween.

Figure 10:
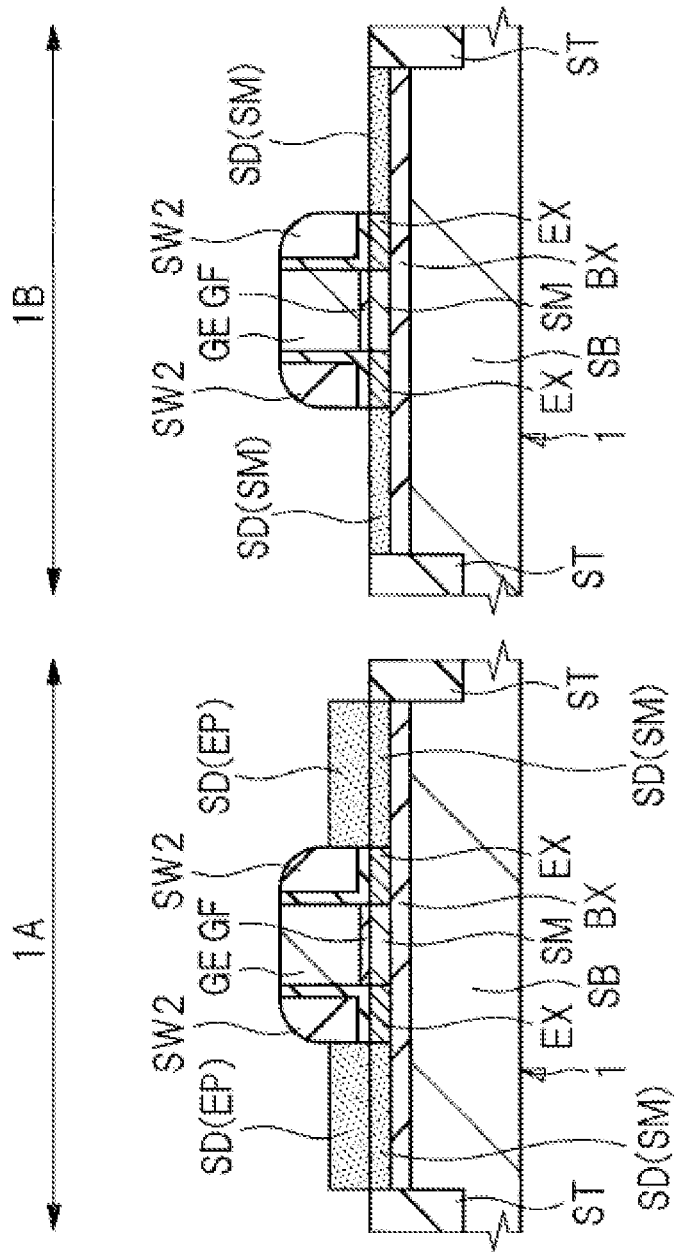
FIG. 10 is a cross-section view during the manufacturing process of the semiconductor device following FIG. 9.

Next, as shown in FIG. 10, n-type impurities such as phosphorus (P) or arsenic (As) are ion-implanted into regions on both sides of the gate electrodes GE and the sidewall spacers SW2 in the semiconductor layers SM and EP of SOI substrate 1 to form n+ type semiconductor regions (source/drain regions) SD. In FIG. 10, a region into which an impurity is implanted by ion implantation at this time is shown by hatching dots.

In the ion implantation for forming n+ semiconductor region SD, the gate electrodes GE and the sidewall spacers SW2 on both sides of the gate electrodes GE can function as ion implantation blocking masks. n+ type semiconductor region SD has higher impurity concentrations than n− type semiconductor region EX.

As shown in FIG. 10, in any of the regions 1A and 1B, n-type semiconductor regions EX are formed on both sides of the gate electrodes GE in the semiconductor layer SM so as to adjoin the channel-forming regions (regions immediately below the gate electrodes GE). That is, n− type semiconductor region EX is formed in the semiconductor layer SM, and specifically, n− type semiconductor region EX is formed in the semiconductor layer SM in a portion located below the insulating film IL1 and the sidewall spacer SW2.

As shown in FIG. 10, in the region 1A, n+ type semiconductor region SD is formed in the semiconductor layers SM and EP at a position separated from the channel-forming region by n− type semiconductor region EX and adjoining n− type semiconductor region EX. Since the semiconductor layer EP is not formed in the region 1B, n+ type semiconductor region SD is formed in the semiconductor layer SM at a position separated from the channel-forming region by n− type semiconductor region EX and adjoining n− type semiconductor region EX. That is, in the region 1A, n+ type semiconductor region SD is formed over the semiconductor layer EP and the semiconductor layer SM below the semiconductor layer EP on both sides of the gate electrode GE, and in the region 1B, n+ type semiconductor region SD is formed in the semiconductor layer SM on both sides of the gate electrode GE.

The semiconductor layer SM located below the gate electrode GE serves as a channel forming region in which a MISFET channel is formed in the semiconductor layer SM. n− type semiconductor region EX and n+ type semiconductor region SD form source/drain regions of LDD structures, i.e., semiconductor regions for source or drain.

Next, activation annealing, which is a heat treatment for activating the impurity introduced into n+ type semiconductor region SD, n− type semiconductor region EX, and the like, is performed. When the ion implanted region is amorphized, it can be crystallized at the time of this activation annealing.

Next, a low-resistance metallic silicide layer SL is formed on n+ semiconductor regions SD and the gate electrodes GE by a salicide (Salicide: Self Aligned Silicide) art.

Figure 11:
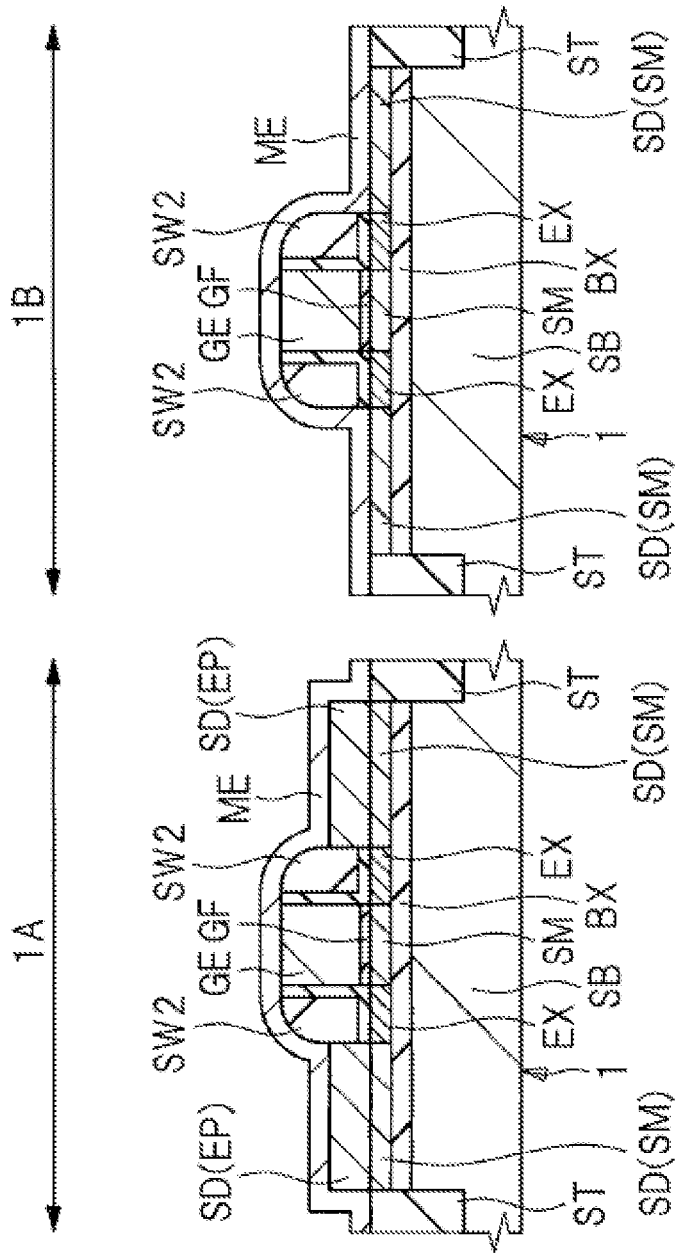
FIG. 11 is a cross-section view during the manufacturing process of the semiconductor device following FIG. 10.
Figure 12:
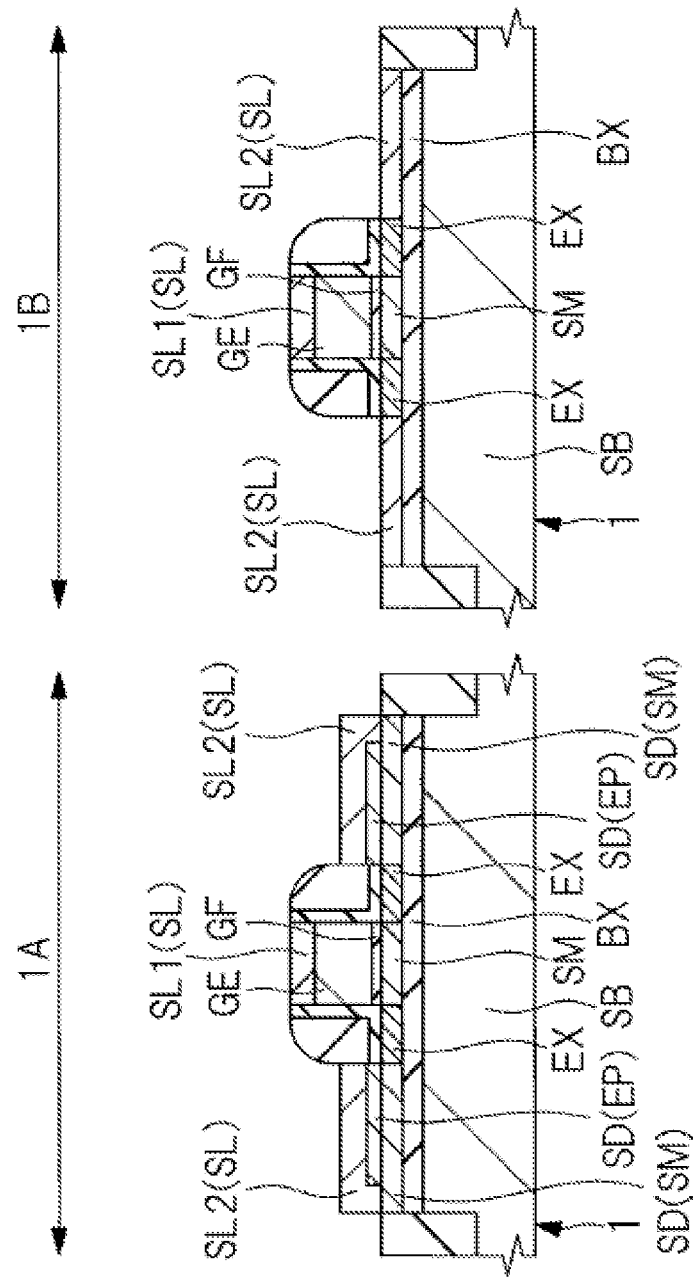
FIG. 12 is a cross-section view during the manufacturing process of the semiconductor device following FIG. 11.

Specifically, the metal silicide layer SL can be formed as follows. That is, as shown in FIG. 11, the metal film ME for forming the metal silicide layer SL is formed on the entire main surface of the SOI substrate 1 including the isolation regions ST so as to cover the gate electrodes GE, the sidewall spacers SW2 and the n+ semiconductor region SD. The metal film ME is made of, for example, a cobalt film, a nickel film, a nickel platinum alloy film, or the like. The thickness of the metal film ME can be, for example, about 10 nm to 50 nm. Then, heat treatment is performed on the SOI substrate 1 to react the upper portion of each of the n+ semiconductor region SD and the gate electrode GE with the metallic film ME. As a result, a metal silicide layer SL is formed in an upper portion of each of the n+ semiconductor region SD and the gate electrode GE, respectively. The metal silicide layer SL is a reaction layer of the semiconductor layer and the metal film ME. Thereafter, the unreacted metallic film ME is removed, and a cross-section view at this stage is shown in FIG. 12. By forming the metal silicide layer SL, the diffusion resistance and the contact resistance of the gate electrode GE and the n+ type semiconductor region SD can be reduced.

Here, the metal silicide layer SL for the gate electrode is referred to as a metal silicide layer SL1 with the reference symbol SL1, and the metal silicide layer SL for the source/drain region is referred to as a metal silicide layer SL2 with the reference symbol SL2. The metal silicide layer SL1 for the gate electrode is formed in the upper portion of the gate electrode GE, and the metal silicide layer SL2 for the source/drain region is formed in the upper portion of the n+ semiconductor region SD. In the area 1A, the semiconductor layer EP or the semiconductor layers EP and SM react with the metal film ME, thereby the metal silicide layer SL2 is formed by silicidation of the semiconductor layer EP or the semiconductor layers EP and SM. In the area 1B, the semiconductor layer SM reacts with the metal film ME, thereby the metal silicide layer SL2 is formed by silicidation of the semiconductor layer SM.

In this manner, a semiconductor device such as a MISFET (transistor) can be formed.

Here, the thickness of the metal silicide layer SL2 formed in the region 1B is thinner than the thickness of the metal silicide layer SL2 formed in the region 1A. That is, when the metal silicide layer SL is formed by the salicide technique, the metal silicide layer SL2 having the expected thickness can be formed in the region 1A, but the thickness of the metal silicide layer SL2 becomes thinner than expected in the region 1B. This is because, since the metal silicide layer SL2 is a reactive layer of the semiconductor layer and the metal film ME, if the thickness of the semiconductor layer below the metal film ME prior to the heat treatment is small, the thickness of the metal silicide layer SL2 formed by the heat treatment is also small. Therefore, when the semiconductor layer EP is formed on the semiconductor layer SM by epitaxial growth as in the region 1A, the metal silicide layer SL2 can secure a predetermined thickness, but when the epitaxial layer EP is not successfully formed on the semiconductor layer SM as in the region 1B, the thickness of the metal silicide layer SL2 formed by the salicide technique is reduced.

Figure 13:
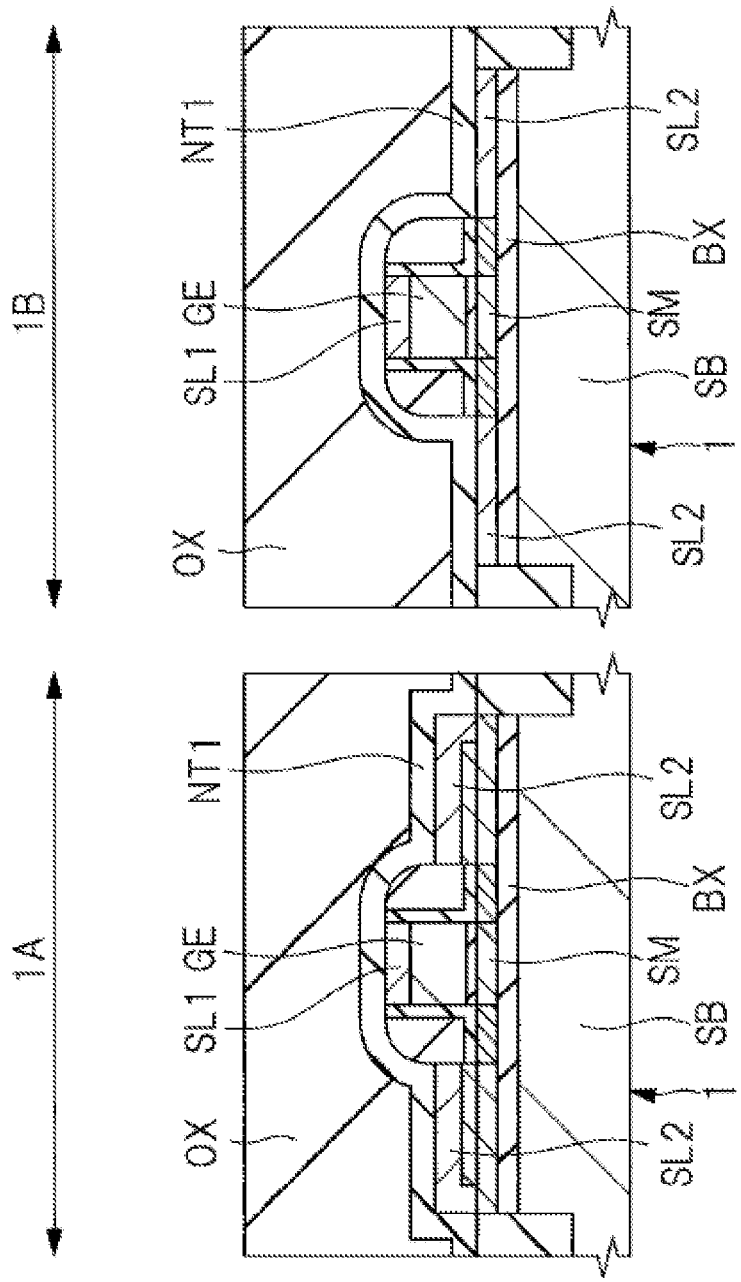
FIG. 13 is a cross-section view during the manufacturing process of the semiconductor device following FIG. 12.

Next, as shown in FIG. 13, an insulating film NT1 is formed on the entire main surface of the SOI substrate 1 including the isolation region ST so as to cover the gate electrodes GE, the side wall spacer SW2 and the metal silicide layers SL1 and SL2 in step S1 of FIG. 1. Then, an interlayer insulating film OX is formed on the insulating film NT1 in step S2 of FIG. 1. After the interlayer insulating film OX is formed, an upper surface of the interlayer insulating film OX may be polished by the CMP method as required.

The insulating film NT1 and the interlayer insulating film OX are made of materials differing from each other, the insulating film NT1 is preferably made of a silicon nitride film, and the interlayer insulating film OX is preferably made of a silicon oxide film. The thickness of the insulating film NT1 (silicon nitride film) is smaller than the thickness of the interlayer insulating film Ox (silicon oxide film). The thickness of the interlayer insulating film OX may be, for example, about 600 nm to 800 nm, and the thickness of the insulating film NT1 may be, for example, about 10 nm to 30 nm. The insulating film NT1 can function as an etching stopper film when the interlayer insulating film OX is etched to form the contact hole. Each of the insulating film NT1 and the interlayer insulating film OX can be formed by, for example, a chemical vapor deposition (Chemical Vapor Deposition) method. Alternatively, the insulating film NT1 may be omitted. The interlayer insulating film OX is formed on the entire main surface of the SOI substrate 1 including the isolation regions ST so as to cover the gate electrodes GE, the sidewall spacers SW2, and the metal silicide layers SL1 and SL2.

Figure 14:
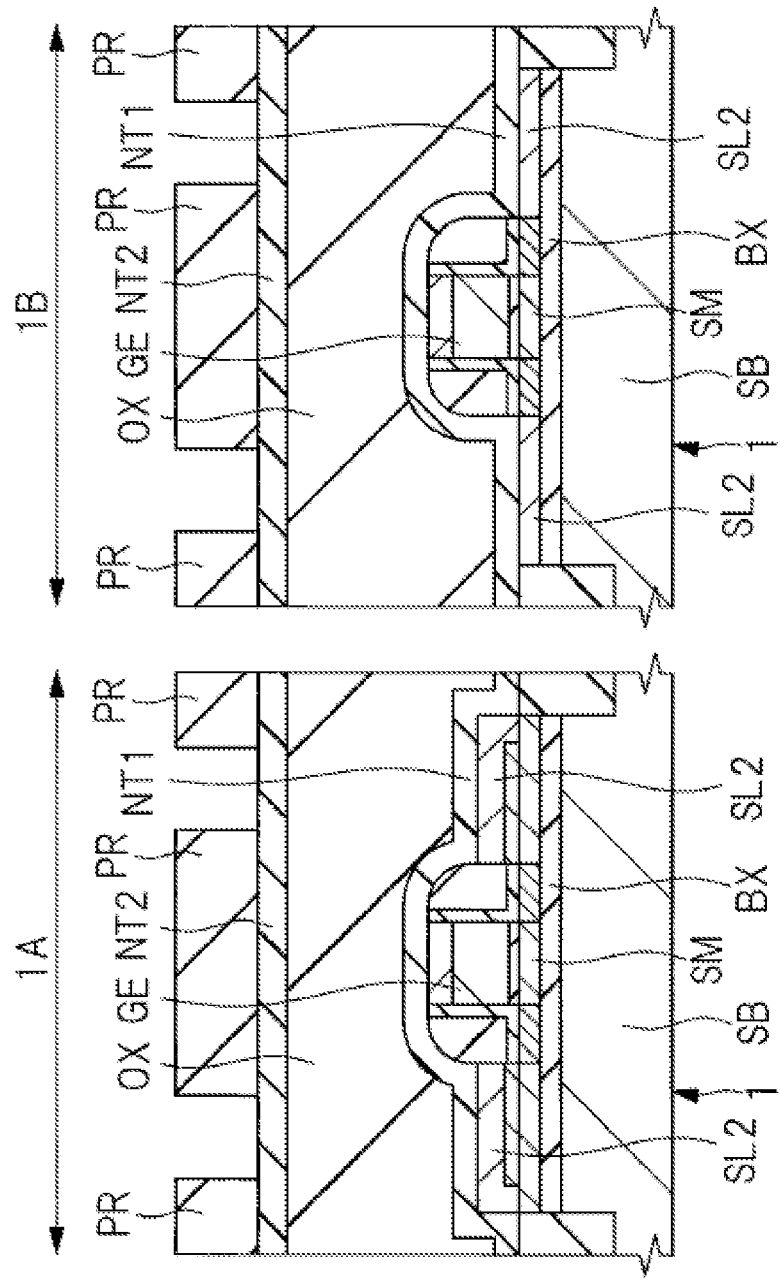
FIG. 14 is a cross-section view during the manufacturing process of the semiconductor device following FIG. 13.

Next, as shown in FIG. 14, an insulating film NT2 is formed on the interlayer insulating film OX (Step S3 in FIG. 1).

The insulating film NT2 is made of a material other than the material of the interlayer insulating film OX, and is preferably made of a silicon nitride film. The insulating film NT2 and the insulating film NT1 are preferably made of the same materials. The thickness of the insulating film NT2 (silicon nitride film) is smaller than the thickness of the interlayer insulating film Ox (silicon oxide film). The thickness of the insulating film NT2 can be, for example, about 20 nm to 40 nm. When the insulating film NT1 is formed, it is preferable that the thickness (formed film thickness) of the insulating film NT2 be thicker than the thickness (formed film thickness) of the insulating film NT1. The insulating film NT2 can be formed by, for example, a CVD method or the like.

Next, a photo resist pattern PR is formed on the insulating film NT2 by photolithography. This step is illustrated in FIG. 14. The photoresist pattern PR has an opening at a position where the photoresist pattern PR forms a contact hole, that is, at a position where the photoresist pattern PR overlaps n+ semiconductor region SD in plan view.

Figure 15:
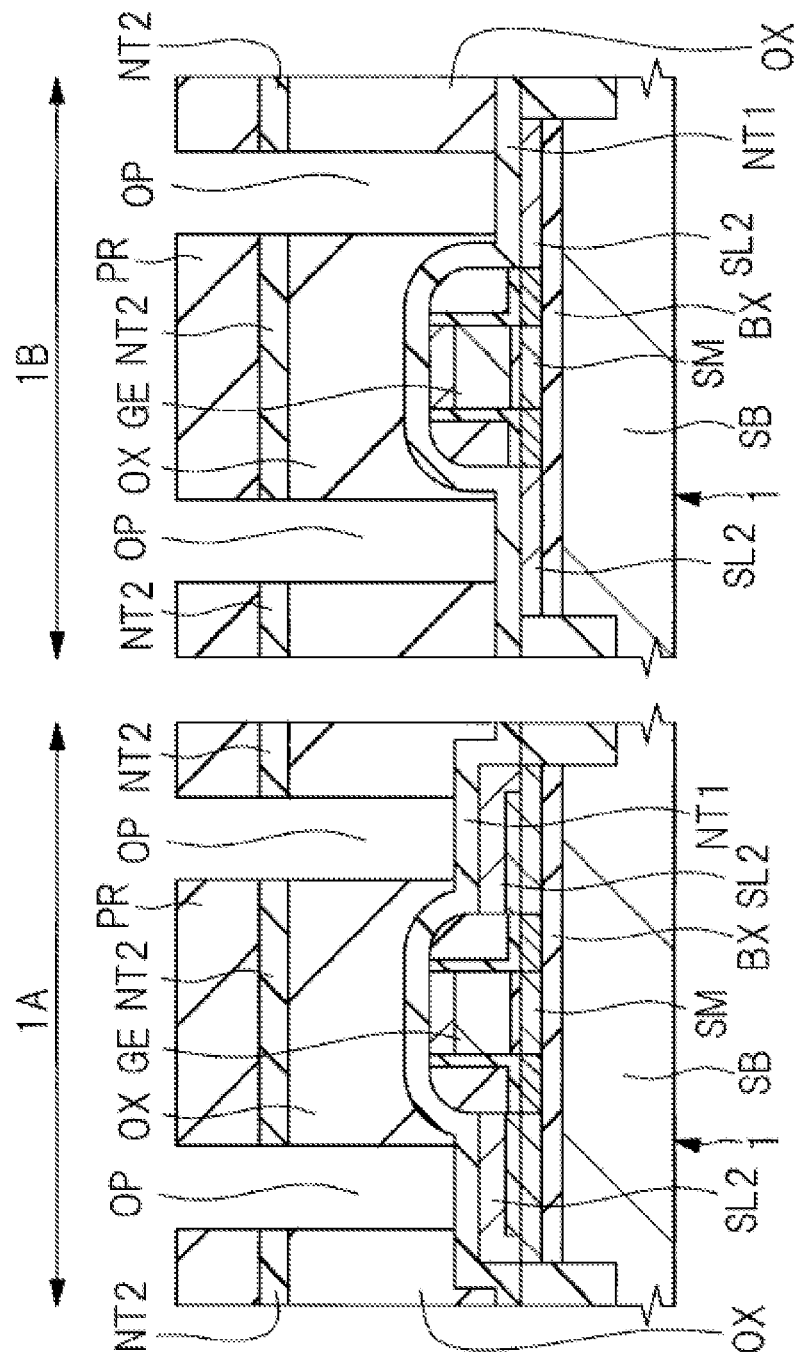
FIG. 15 is a cross-section view during the manufacturing process of the semiconductor device following FIG. 14.

Next, as shown in FIG. 15, an opening OP is formed in the insulating film NT2 by etching (preferably dry-etched) the insulating film NT2 using the photoresist pattern PR as an etching mask (Step S4 in FIG. 1). The opening OP penetrates through the insulating film NT2, and the interlayer insulating film OX is exposed at the bottom of the opening OP. At this stage, the opening OP does not penetrate through the interlayer insulating film OX. Since the etching in step S4 is performed under a condition that the insulating film NT2 is more easily etched than the interlayer insulating film OX, that is, under a condition that the etching rate of the insulating film NT2 is higher than the etching rate of the interlayer insulating film OX, the insulating film NT2 is selectively etched, and the interlayer insulating film OX functions as an etching stopper film. The opening OP is formed at a position aligned with the opening of the photoresist pattern PR. The opening OP is formed at a position overlapping with the n+ semiconductor region SD in plan view, and therefore, the opening OP is formed at a position overlapping with the metal silicide layer SL2 in plan view.

Next, the interlayer insulating film OX exposed at the bottom of the opening OP is etched (preferably dry-etched) using the photoresist pattern PR as an etching mask, thereby forming the opening OP in the interlayer insulating film OX (step S5 in FIG. 1). As a result, the opening OP penetrates through the insulating film NT2 and the interlayer insulating film OX, and the insulating film NT1 is exposed at the bottom of the opening OP. At this stage, the opening OP does not penetrate through the insulating film NT1. FIG. 15 shows this stage. Since the etching in step S5 is performed under a condition that the interlayer insulating film OX is more easily etched than the insulating film NT1, that is, under a condition that the etching rate of the interlayer insulating film OX is higher than the etching rate of the insulating film NT1, the interlayer insulating film OX is selectively etched, and the insulating film NT1 functions as an etching stopper film. Thereafter, the photoresist pattern PR is removed by asking or the like.

Figure 16:
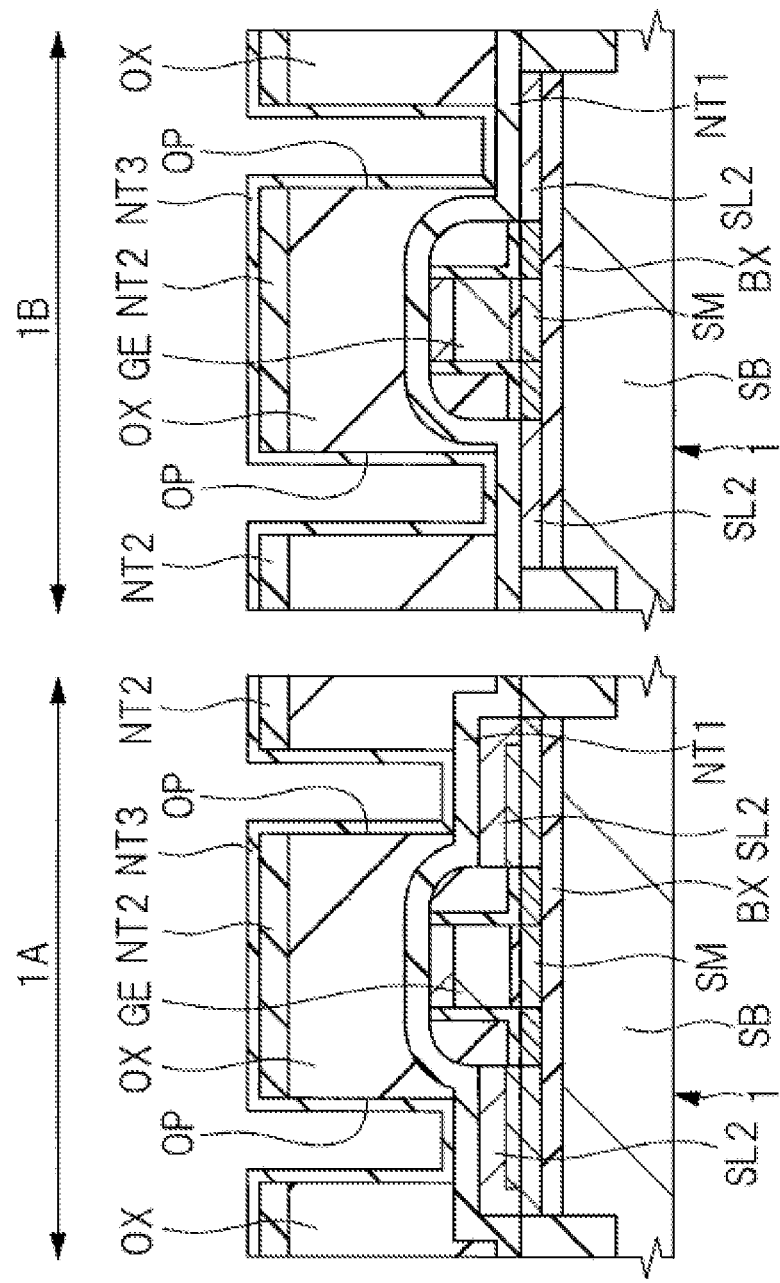
FIG. 16 is a cross-section view during the manufacturing process of the semiconductor device following FIG. 15.

Next, as shown in FIG. 16, an insulating film NT3 is formed on the insulating film NT2 including the bottom portion (bottom surface) of the opening OP and the side surface (inner wall) of the opening OP (Step S6 in FIG. 1).

The insulating film NT3 is preferably made of the same materials as the insulating film NT2, and is preferably a silicon nitride film. The thickness of the insulating film NT3 (silicon nitride film) is smaller than the thickness of the interlayer insulating film Ox (silicon oxide film). The thickness of the insulating film NT3 can be, for example, about 5 nm to 10 nm. The insulating film NT3 can be formed by, for example, a CVD method or the like. At the upper surface of the interlayer insulating film OX, a laminated film comprised of the insulating film NT2 and the insulating film NT3 formed on the insulating film NT2 is formed. Also, at the side surface of the opening OP, which is a side surface of the interlayer insulating film OX, an insulating film NT3 is formed. Further, since the insulating film NT3 is formed in such a state that the insulating film NT1 is exposed at the bottom of the opening OP, the insulating film NT3 is formed on the insulating film NT1 at the bottom of the opening OP.

Figure 17:
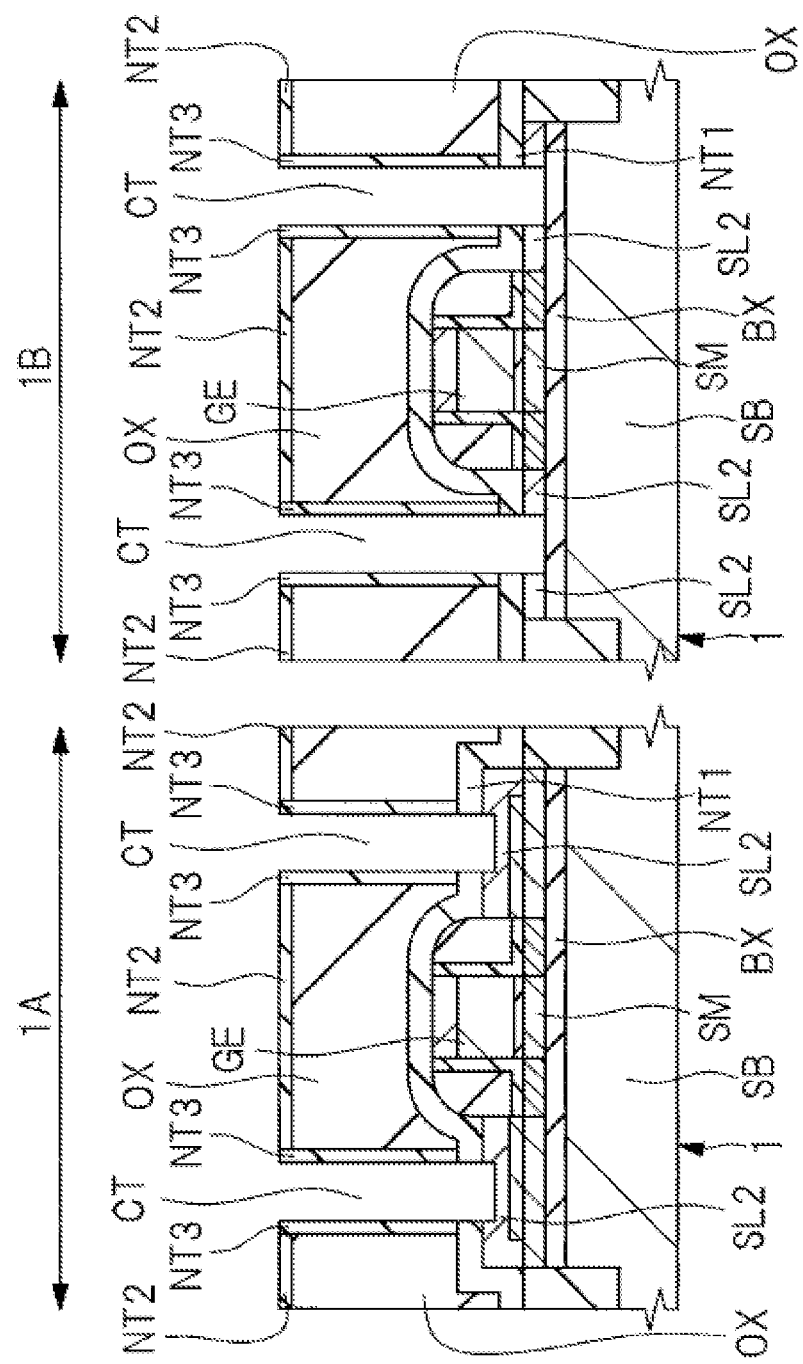
FIG. 17 is a cross-section view during the manufacturing process of the semiconductor device following FIG. 16.

Next, as shown in FIG. 17, the insulating film NT3 formed at the bottom of the opening OP and the insulating film NT1 formed at the bottom of the opening OP are etched away (Step S7 of FIG. 1). The insulating film NT3 formed at the bottom of the opening OP and the insulating film NT1 formed at the bottom of the opening OP are removed by the etching in S7, thereby the metal silicide layer SL2 is exposed at the bottom of the opening OP. As a result, a contact hole CT, which is a through hole reaching to the metal silicide layer SL2, is formed. The contact hole CT is formed of the opening OP, and the inner wall (side surface) of the contact hole CT is formed by the surface of the insulating film NT3 remaining in a layered manner on the side surface of the opening OP. Therefore, the radius of the contact hole CT is smaller than the radius of the opening OP by the thickness of the insulating film NT3 remaining in a layered manner on the side surface of the opening OP. The etching in S7 is performed under a condition that the metal silicide layer SL (SL2) and the insulating layer BX are less etched than the insulating films NT3 and NT1.

The etching in step S7 is preferably dry etching, and anisotropic dry etching is particularly preferable. As a result, in the etching in S7, the insulating film NT3 formed at the side surface of the opening OP is hardly etched. Therefore, the insulating film NT3 remains in the form of a layer on the side surface of the opening OP of the interlayer insulating film OX at the stage when the etch of step S7 is completed. In addition, the etching of step S7 is started while a multilayer film of the insulating film NT2 and the insulating film NT3 is formed on upper surface of the interlayer insulating film OX. Therefore, as the insulating film NT3 formed at the bottom of the opening OP is removed by the etching in step S7, the insulating film NT3 of the insulating film NT2 and NT3, which is formed on upper surface of the interlayer insulating film OX, is also removed by the etching in step S7. Further, as the insulating film NT1 at the bottom of the opening OP is removed by the etching in step S7, a part of the thickness of the insulating film NT2 on upper surface of the interlayer insulating film OX is also removed by the etching in step S7. However, it is preferable that the thickness of the insulating film NT3 to be formed in step S6 is set so that the insulating film NT3 remains in a layered manner on upper surface of the interlayer insulating film OX at the stage when the etch in step S7 is completed. In this respect, it is preferable that the film thickness of the insulating film NT2 be thicker than the film thickness of the insulating film NT1. Therefore, the whole insulating film NT3 and a part of the thickness of the insulating film NT2 in the insulating film NT2 and NT3 on the upper surface of the interlayer insulating film OX are removed by the etching in S7, but the insulating film NT2 remains in a layered state on the upper surface of the interlayer insulating film OX.

Therefore, when the step S7 is performed, the insulating film NT1,NT3 is removed at the bottom of the opening OP to expose the metal silicide layer SL, the insulating film NT3 remains in a layered state on the side surface of the opening OP of the interlayer insulating film OX, and the insulating film NT2 remains in a layered state on upper surface of the interlayer insulating film OX. Since the side surface of the opening OP of the interlayer insulating film OX is covered with the insulating film NT3 and the upper surface of the interlayer insulating film OX is covered with the insulating film NT2, it is possible to prevent the interlayer insulating film OX from being exposed at the stage of completing the etch of S7.

Here, in the region 1B, the insulating film NT1,NT3 is not only removed at the bottom of the opening OP by the etching in step S7, but also the metal silicide layer SL is etched and removed, and there is a possibility that the insulating layer BX is exposed (see region 1B in FIG. 17). The reason for this is that the thickness of the metallic silicide SL2 formed by the salicide technique becomes thinner than expected in the region 1B.

That is, the etching in step S7 is performed in order to remove the insulating film NT1,NT3 at the bottom of the opening OP to expose the metal silicide layer SL2, but if the removal of the insulating film NT1,NT3 on the metal silicide layer SL2 is inadequate, the reliability of the electric connection between the plug PG and the metal silicide layer SL2 to be formed later is lowered. For this reason, in the etching in S7, the etching condition (etching duration or the like) needs to be set on the premise that the over-etching is performed to some extent so that the insulating films NT1 and NT3 can be sufficiently removed at the bottom of the opening OP (that is, so that the remaining portion of the insulating films NT1 and NT3 is not generated). For this reason, in the etching of step S7, the metal silicide layer SL2 exposed at the bottom of the opening OP is also etched to some extent. Therefore, the etching condition (etching duration or the like) of S7 is set so that the etching quantity (etching thickness) of the metal silicide layer SL2 is smaller than the thickness of the metal silicide layer SL2 formed by the salicide technique. As a result, even if the metal silicide layer SL2 exposed at the bottom of the opening OP is etched in step S7, the etching amount (etching thickness) of the metal silicide layer SL2 becomes smaller than the thickness of the metal silicide layer SL2, so that the metal silicide layer SL2 remains in a layered state at the bottom of the opening OP, and the contact hole CT does not need to penetrate through the metal silicide layer SL2 (see region 1A of FIG. 17).

However, when the thickness of the metal silicide layer SL2 becomes thinner than expected when the metal silicide layer SL2 is formed, the entire thickness of the metal silicide layer SL2 is etched at the bottom of the opening OP in Step S7, and the contact hole CT may penetrate through the metal silicide layer SL2 to expose the insulating layer BX at the bottom of the contact hole CT.

Therefore, when the epitaxial layer EP is properly formed on the semiconductor layer SM as in the region 1A, the thickness of the metal silicide layer SL2 increases, and therefore, as shown in the region 1A of FIG. 17, the contact hole CT does not penetrate through the metal silicide layer SL2. On the other hand, when the epitaxial layer (semiconductor layer EP) is not successfully formed on the semiconductor layer SM as in the region 1B, the thickness of the metal silicide layer SL2 is reduced, and therefore, as shown in the region 1B of FIG. 17, the contact hole CT penetrates through the metal silicide layer SL2, and there is a possibility that the insulating layer BX is exposed at the bottom of the contact hole CT.

Therefore, when a large number of MISFET are formed, in most MISFET, the metal silicide layer SL2 having a predetermined thickness is formed, and the contact hole CT does not penetrate through the metal silicide layer SL2, but in some MISFET, the thickness of the metal silicide layer SL2 is reduced, and the contact hole CT penetrates through the metal silicide layer SL2, and the insulating layer BX may be exposed at the bottom of the contact hole CT. FIG. 17 shows cross-sectional view of the region 1A and cross-sectional view of the region 1B. In the area 1A, the epitaxial layer EP is accurately formed on the semiconductor layer SM, the metal silicide layer SL2 having a predetermined thickness is formed, and the contact hole CT does not penetrate through the metal silicide layer SL2. On the other hand, in the area 1B, the epitaxial layer (semiconductor layer EP) is not successfully formed on the semiconductor layer SM, the thickness of the metal silicide layer SL2 formed by the salicide technique is reduced, the contact hole CT penetrates through the metal silicide layer SL2, and the insulating layer BX is exposed at the bottom of the contact hole CT.

Therefore, there is a possibility that a portion having the structure of the region 1A and a portion having the structure of the region 1B are mixed.

Figure 18:
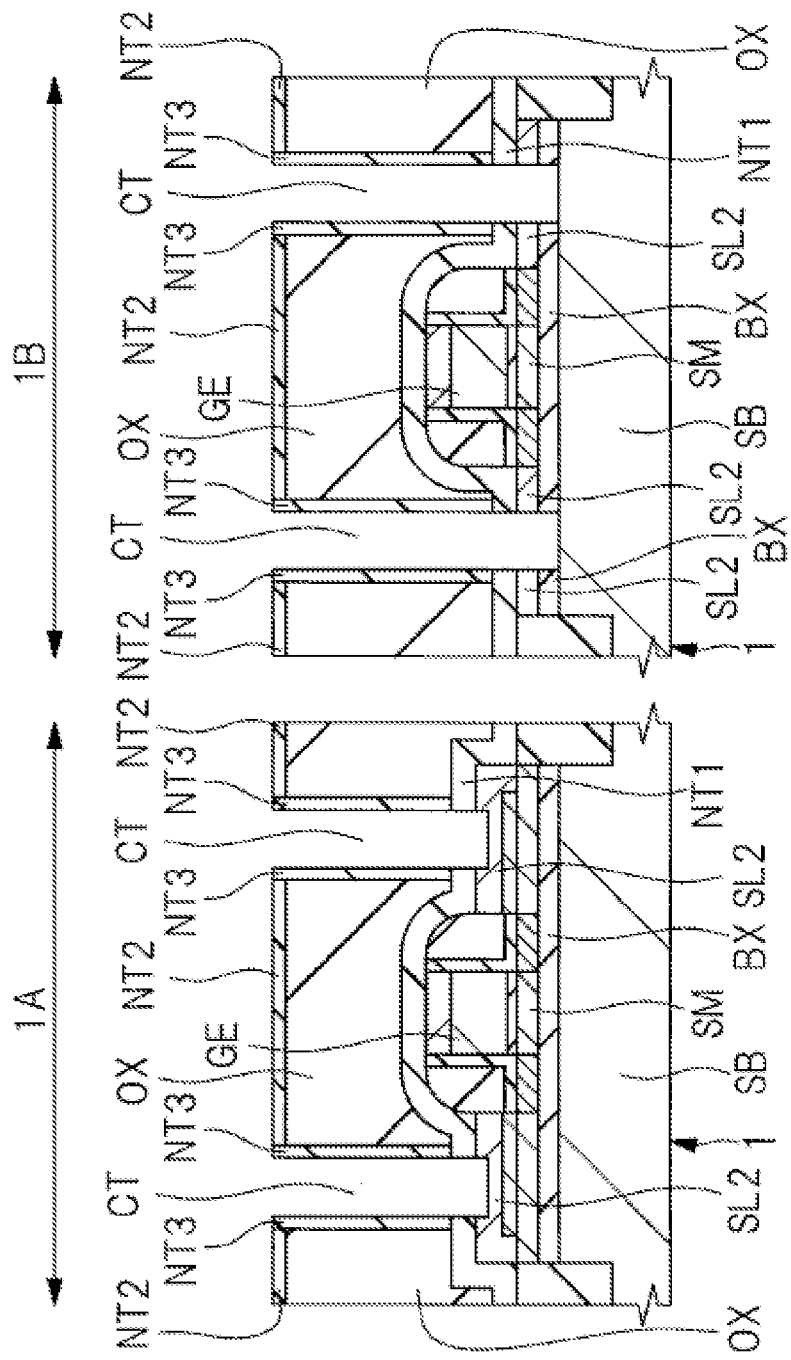
FIG. 18 is a cross-section view during the manufacturing process of the semiconductor device following FIG. 17.

Then, in the present first embodiment, after the etching in step S7, as shown in FIG. 18, an etching step capable of selectively etching the insulating layers B X is performed in step S8 in FIG. 1. This etching step is hereinafter referred to as the etching step of step S8. The contact hole CT (opening OP) is etched by the etching process of step S8.

The etching step of S8 is performed under a condition that the insulating film NT2 and the insulating film NT3 are less etched than the insulating layer BX, that is, under a condition that the etching rate of each of the insulating films NT2 and NT3 is lower than the etching rate of the insulating layer BX. In other words, the etching step of step S8 is performed under a condition that the insulating layer BX is more easily etched than the insulating films NT2 and NT3, that is, under a condition than the etching rate of the insulating layer BX is higher than the etching rate of each of the insulating films NT2 and NT3.

FIG. 18 shows a stage where the etching process of step S8 is completed. At the stage of completing the etching process of step S8, as shown in FIG. 18, the interlayer insulating film OX is not exposed because the side surface of the opening OP, which is a side surface of the interlayer insulating film OX, is covered with the insulating film NT3 and the upper surface of the interlayer insulating film OX is covered with the insulating film NT2. Therefore, the etching step of step S8 is performed in such a state that the side surface of the opening OP, which is a side surface of the interlayer insulating film OX, is covered with the insulating film NT3, and the upper surface of the interlayer insulating film OX is covered with the insulating film NT2. That is, the etching process of step S8 can be performed in such a state that the interlayer insulating film OX is not exposed. As described above, the etching step of step S8 is performed under a condition that each of the insulating film NT2 and the insulating film NT3 is less etched than the insulating film BX. Therefore, in the etching step of step S8, the insulating films NT2 and NT3 is hardly etched, and the insulating film NT3 on the side surface of the opening OP, which is the side surface of the interlayer insulating film OX, and the insulating film NT2 on upper surface of the interlayer insulating film OX can function as a film for preventing etching of the interlayer insulating film OX. Therefore, in the etching step of step S8, it is possible to suppress or prevent the interlayer insulating film OX from being etched while allowing the insulating layer BX to be etched.

In particular, when the insulating layer BX and the interlayer insulating film OX are made of the same material, preferably silicon oxide, if the insulating film NT3 on the side surface of the opening OP of the interlayer insulating film OX and the insulating film NT2 on upper surface of the interlayer insulating film OX do not exist, the interlayer insulating film OX is also etched considerably when the insulating layer BX is removed in the etching step of step S8. If the interlayer insulating film OX is etched, the shapes of the contact holes may vary and upper surface flatness of the interlayer insulating film OX may deteriorate, so that a problem may occur when the plug PG is formed later or when the wires M1 are formed later. Therefore, it is desirable to prevent the interlayer insulating film OX from being etched when the insulating layer BX is removed in the etching process of step S8 as much as possible.

In contrast, in the present first embodiment, in the etching step S8, since the insulating film NT3 on the side surface of the opening OP of the interlayer insulating film OX and the insulating film NT2 on upper surface of the interlayer insulating film OX can function as a film for preventing the etching of the interlayer insulating film OX, the etching of the interlayer insulating film OX can be suppressed or prevented. Therefore, it is possible to prevent the variation in the shapes of the contact holes caused by the etching of the interlayer insulating film OX and the decrease in the flatness of upper surface of the interlayer insulating film OX from occurring, so that it is possible to prevent the occurrence of a problem when the plug PG is formed later or when the wires M1 are formed later. Therefore, the reliability of the semiconductor device can be improved. Therefore, by applying the present first embodiment when the insulating layer BX and the interlayer insulating film OX is made of the same material (preferably silicon oxide), the effect is extremely large.

It is more preferable that the side surface of the opening OP of the interlayer insulating film OX is covered with the insulating film NT3 and upper surface of the interlayer insulating film OX is covered with the insulating film NT2 at the stage when the etching process of step S8 is completed, thereby preventing the interlayer insulating film OX from being etched during the etching process of step S8. Therefore, it is preferable to set the film thickness of each of the insulating films NT2,NT3 so that the side surface of the opening OP of the interlayer insulating film OX is covered with the insulating film NT3 and upper surface of the interlayer insulating film OX is covered with the insulating film NT2 at the stage when the etching process of step S8 is completed. The radius of the opening OP is made larger than the required radius of the contact hole CT by the thickness of the insulating film NT3 remaining on the side surface of the opening OP after the etching step S8.

In addition, since the etching step of step S8 is performed under a condition that the insulating layer BX is more easily etched than the insulating film NT2,NT3, when the insulating layer BX is exposed at the bottom of the contact hole CT as in the area 1B, the insulating layer BX at the bottom of the contact hole CT can be removed to expose semiconductor substrate SB. That is, in the region 1B, the contact hole CT penetrates through the insulating layer BX to reach semiconductor substrate SB, and semiconductor substrate SB at the bottom of the contact hole CT can be exposed.

In the present first embodiment, in the etching step S8, the entire thickness of the insulating layer BX is set to an etching amount (etching thickness) that can etch the insulating layer BX. That is, when the insulating layer BX is exposed at the bottom of the contact hole CT as in the area 1B of FIG. 17 at the stage of completing the etching of step S7, the condition of the etching process of step S8 (e.g., etching duration) is set so that the entire thickness of the insulating layer BX at the bottom of the contact hole CT is etched and the contact hole CT penetrates through the insulating layer BX when the etching process of step S8 is performed. Specifically, when the thickness of the insulating layer BX at the stage where SOI substrate 1 is prepared is T1, the etching step of step S8 is performed under a condition that the insulating layer BX having the thickness T1 can be etched.

When the insulating layer BX is exposed at the bottom of the contact hole CT as in the area 1B of FIG. 17 at the stage when the etching of step S7 is completed, it is preferable to set a slight overetching in the etching step of step S8 so that the contact hole CT can always penetrate through the insulating layer BX in the etching step of step S8. However, if the set value of the overetching in the etching step S8 is too large, the etching amount of the metal silicide layer SL2 increases when the metal silicide layer SL2 remains in a layered state at the bottom of the contact hole CT as in the area 1A of FIG. 17, but the etching amount of the metal silicide layer SL2 does not desirably increase. Therefore, it is preferable that the set value of the overetching in the etching step of step S8 is not too large. Therefore, it is preferable that the set value of the overetching in the etching step of step S8 is set to about 10% of the thickness T1 of the insulating layer BX. For example, when the thickness of the insulating layer BX at the stage where SOI substrate 1 is prepared is T1, the etching step of step S8 is preferably performed under a condition that the insulating layer BX having a thickness of T1×1.1 can be etched. To give examples of specific numerical values, when the insulating layer BX at the stage of preparing SOI substrate 1 is a silicon oxide film having a thickness of 15 nm, it is preferable to perform the etching step of step S8 under a condition that the silicon oxide film having a thickness of 16.5 nm can be etched.

In the etch process step of step S8, wet etching or dry etching can be used. In the case of wet etching, hydrofluoric acid (an aqueous solution of hydrofluoric acid, diluted hydrofluoric acid) can be suitably used as the etchant. In the case of dry etching, fluorocarbon (fluorocarbon gas) can be suitably used as an etching gas.

Further, in the area 1A, since the etching process of step S8 is performed while the metal silicide layer SL2 is exposed at the bottom of the contact hole CT, it is desirable to suppress etching of the metal silicide layer SL2 in the etching process of step S8 as much as possible. Therefore, the etching step of step S8 is performed under a condition that the metal silicide layer SL2 (SL) is hardly etched as compared with the insulating layer BX, that is, under a condition in which the etching rate of the metal silicide layer SL2 (SL) is smaller (lower) than the etching rate of the insulating layer BX.

In the etching step S8, it is desirable to set the etching condition such that the etching selectivity of the insulating layer to the metal silicide layer SL2 and the insulating films NT2 and NT3 is as high as possible. The etching selection ratio of the insulating layer BX to the metal silicide layer SL2 (SL) and the insulating film NT2,NT3 corresponds to the ratio of the etching speed of the insulating layer BX to the etching speed of each of the metal silicide layer SL2 (SL) and the insulating film NT2,NT3. Since wet etching tends to increase the etching selectivity of the insulating layer relative to the metal silicide layer SL2, it is more preferable to use wet etching in the etching step S8. In particular, wet etching using hydrofluoric acid can etch silicon oxide at a high selectivity. Therefore, the insulating layer BX is formed of silicon oxide, and wet etching using hydrofluoric acid is applied to the etching step of step S8, whereby the insulating layer BX can be selectively etched in the region 1B while suppressing the etching of the metal silicide layer SL2 in the region 1A.

Silicon oxide has a higher etching selectivity than silicon nitride and the like. Therefore, the etching thickness of the metallic silicide layer SL2 can be reduced in step S8 for etching the insulating layer BX made of silicon oxide, as compared with step S7 for etching the insulating film NT3 and NT1. Therefore, in the etching step of step S8, the etching quantity of the metal silicide layer SL2 at the bottom of the contact hole CT is reduced in the area 1A, and the contact hole CT can be prevented from penetrating the metal silicide layer SL2.

When wet etching is applied to the etching process of S8, damage caused by dry etching can be prevented from being applied to SL2 of the metallic silicide layers in the region 1A.

On the other hand, when dry etching is applied to the etching step of step S8, side etching of the insulating layer BX can be suppressed.

Upon completion of the etching of step S7, as shown in FIG. 17, in the area 1A, the metal silicide layer SL2 is exposed at the bottom of the contact hole CT, while the contact hole CT does not penetrate through the metal silicide layer SL2, in the area 1B, the contact hole CT penetrates through the metal silicide layer SL2, and the insulating layer BX is exposed at the bottom of the contact hole CT. At the stage when the etching process of step S8 is completed, as shown in FIG. 18, in the region 1A, the metal silicide layer SL2 is exposed at the bottom of the contact hole CT, and the contact hole CT does not penetrate through the metal silicide layer SL2, but in the region 1B, the contact hole CT penetrates through the metal silicide layer SL2 and the insulating layer BX, and semiconductor substrate SB is exposed at the bottom of the contact hole CT.

When a plurality of SOI substrate 1 is flowed through the manufacturing lines to perform a manufacturing process of a semiconductor device on the respective SOI substrate 1, not only a SOI substrate 1 in which the structure of the region 1A of FIG. 17 exists but the structure of the region 1B of FIG. 17 does not exist, but also a SOI substrate 1 in which the structure of the region 1A of FIG. 17 and the structure of the region 1B of FIG. 17 coexist at the stage of completing the etching of step S7. However, it is difficult to confirm whether or not the structures of the region 1B shown in FIG. 17 are present in the respective SOI substrate 1 at the stage when the etch of S7 is completed. Therefore, in the present first embodiment, the etching process of step S8 is performed at the stage of completing the etching of step S7, regardless of whether or not the structures of the region 1B of FIG. 17 exist. Therefore, when the structure of the region 1B in FIG. 17 exists even at the stage of completing the etching in step S7, the portion inevitably becomes the structure of the region 1B in FIG. 18 when the etching process in step S8 is performed. Therefore, not only SOI substrate 1 in which the structure of the region 1A in FIG. 18 exists but the structure of the region 1B in FIG. 18 does not exist, but also SOI substrate 1 in which the structure of the region 1A in FIG. 18 and the structure of the region 1B in FIG. 18 coexist at the stage of completing the etching process in step S8.

Figure 19:
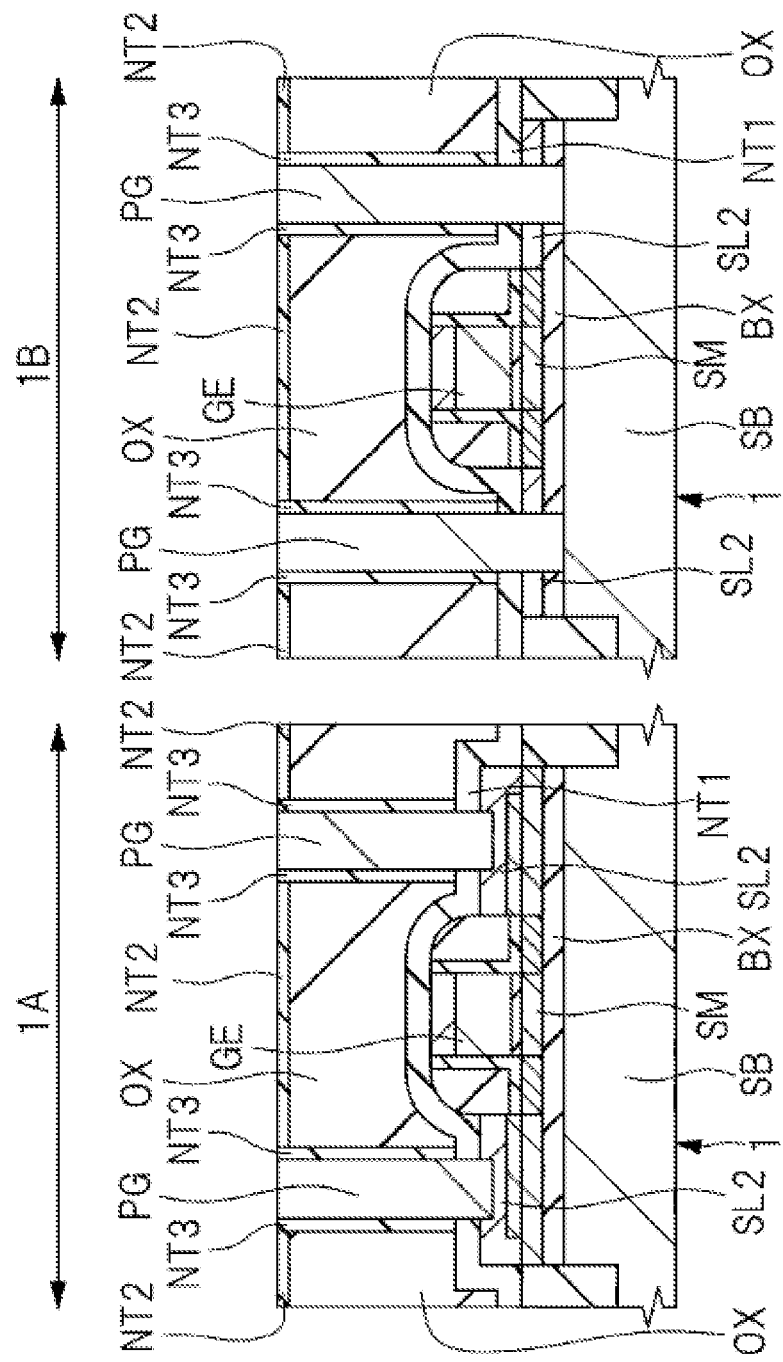
FIG. 19 is a cross-section view during the manufacturing process of the semiconductor device following FIG. 18.

After the etching step in step S8, as shown in FIG. 19, a plug PG comprised of a conductive material is formed inside of the contact hole CT (opening OP) (step S1 in FIG. 1). The plug PG can be formed, for example, as follows.

First, a conductive film for forming the plug PG is formed on the interlayer insulating film OX (insulating film NT2) including the inside of the contact holes CT. The conductor film is a laminated film of a barrier conductor film and a tungsten film. Then, an unnecessary conductor film (conductor film for forming the plug PG) outside the contact hole CT is removed by a CMP method, an etchback method, or the like, and a conductor film (conductor film for forming the plug PG) is left in the contact hole CT. Thus, the plug PG made of the conductor film remaining in the contact hole CT can be formed. The plug PG is buried in the contact hole CT.

The plug PG for the source/drain region is provided to supply a predetermined electric potential to the source/drain region, here the n+ semiconductor region SD, via the metal silicide layer SL2. Therefore, originally, the plug PG for the source/drain region is arranged on the metal silicide layer SL2, and the bottom surface of the plug PG for the source/drain region is in contact with upper surface of the metal silicide layer SL2, so that the plug PG for the source/drain region and the metal silicide layer SL2 should be electrically connected to each other, and the region 1A has such a configuration. In the region 1A, the plug PG for the source/drain region is not in contact with the semiconductor substrate SB. On the other hand, in the region 1B, the lower surface of the plug PG for the source/drain region is in contact with semiconductor substrate SB, and the plug PG for the source/drain region and the semiconductor substrate SB are electrically connected with each other.

Figure 20:
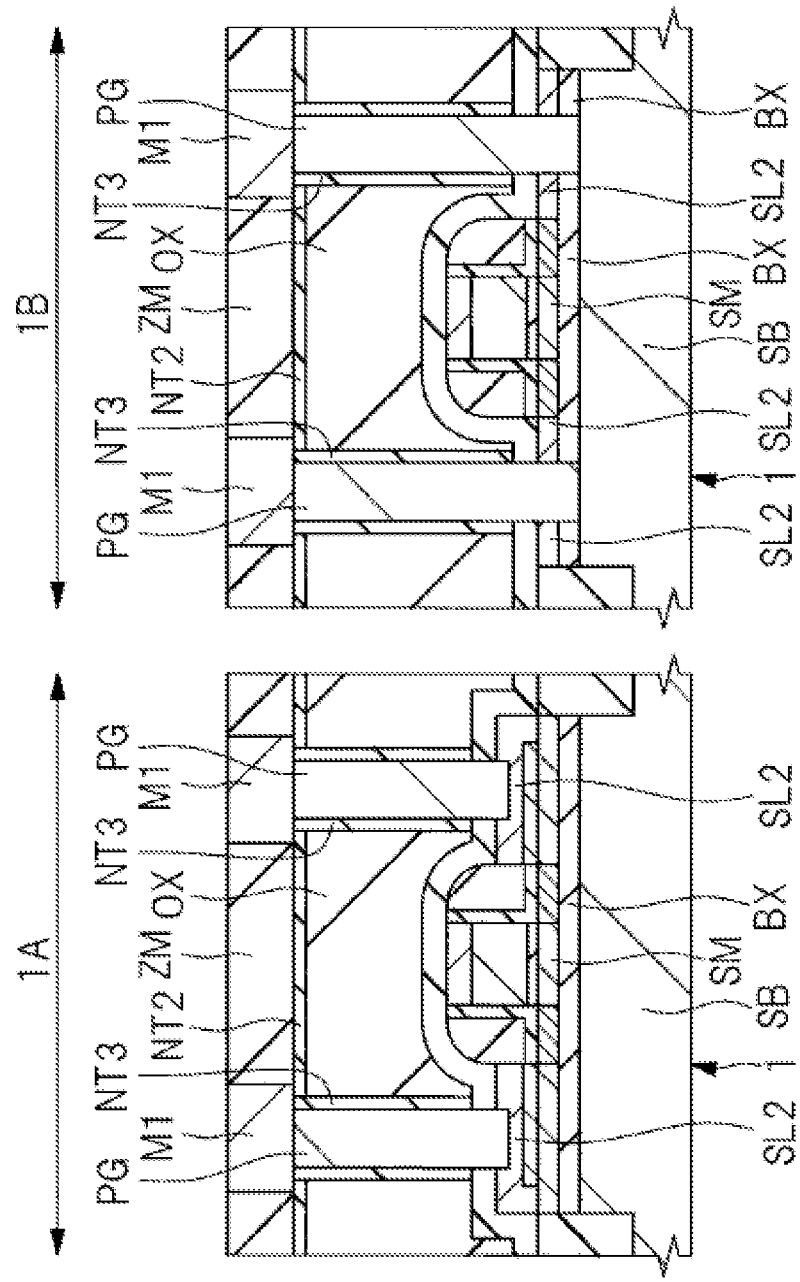
FIG. 20 is a cross-section view during the manufacturing process of the semiconductor device following FIG. 19.

Next, as shown in FIG. 20, an insulating film ZM is formed on the interlayer insulating film OX (insulating film NT2) in which the plug PG is buried. Then, after a wiring groove is formed in a predetermined region of the insulating film ZM, the wiring M1 is buried in the wiring groove by using a single damascene technique. The wiring M1 is, for example, a copper wiring including copper as a main component, i.e., a buried copper wiring. Upper surface of the plug PG is in contact with the wiring M1, so that the plug PG and the wiring M1 are electrically connected to each other.

Thereafter, the wiring of the second and subsequent layers is formed by a dual damascene method or the like, but illustration and description thereof are omitted here. The wiring M1 and the wiring on the upper layer thereof are not limited to the damascene wiring, and may be formed by patterning a conductive film for wiring, and may be, for example, a tungsten wiring or an aluminum wiring.

In this manner, SOI substrate 1 is subjected to wafer processing. The wafer process is also referred to as a pre-process. Here, the wafer process generally refers to a process of forming various elements, interconnection layers, and pad electrodes on the main surface of a semiconductor wafer (here, SOI substrate 1), forming a surface protective film, and then making it possible to electrically test each of a plurality of chip regions formed on the semiconductor wafer (here, SOI substrate 1) by probes or the like. The chip regions of the semiconductor wafer (here, SOI substrate 1) correspond to regions of the semiconductor wafer (here, SOI substrate 1) from which one semiconductor chip is obtained.

Thereafter, by performing a probe test (so-called wafer test) using the pads, it is possible to electrically test the respective chip regions of the semiconductor wafer (here, SOI substrate 1). The results of the probe test can be used to improve yield and reliability by selecting whether each chip area of the semiconductor wafer (here, SOI substrate 1) is a non-defective chip or a defective chip, or by feeding back the data of the measured results of the probe test to each manufacturing process.

In the region 1A, the plug PG for the source/drain region is not electrically connected to semiconductor substrate SB, while in the region 1B, the plug PG for the source/drain region is electrically connected to semiconductor substrate SB, so that it can be determined in the probe test whether or not the plug PG for the source/drain region is electrically connected to semiconductor substrate SB. That is, in the probe test, it is possible to determine whether or not a structure such as a region 1B exists in the probe test. Therefore, a chip region in which a structure such as the region 1B (a structure in which the plug PG for the source/drain region is electrically connected with the semiconductor substrate SB) exists can be selected as a defective chip region.

Thereafter, by performing a dicing process, SOI substrate 1 is cut (diced) and divided (singulated) into a plurality of semiconductor chips. That is, SOI substrate 1 is cut along the scribed area. As a result, the semiconductor chip is obtained from the chip regions of SOI substrate 1.

As described above, semiconductor device of the present first embodiment is manufactured.

Note that a test for determining whether or not a structure such as the region 1B (a structure in which the plug PG for the source/drain region is electrically connected with the semiconductor substrate SB) exists can be performed not in the probe test but on a semiconductor chip which is singulated by dicing or on a semiconductor package in which the semiconductor chip is packaged.

In the present first embodiment, although an n-channel type MISFET is formed as an MISFE, a p-channel type MISFET can be formed by reversing the conductivity type, or both an n-channel type MISFET and a p-channel type MISFET can be formed.

<Backgraound of Study>

FIGS. 21 to 24 are main portion cross-sectional view of examined example studied by the present inventor during the manufacturing process of semiconductor device. Up to the step shown in FIG. 13, the manufacturing process of semiconductor device of examined example is also the same as the manufacturing process of semiconductor device of the present first embodiment described above, and therefore repetitive descriptions thereof are omitted here.

Figure 21:
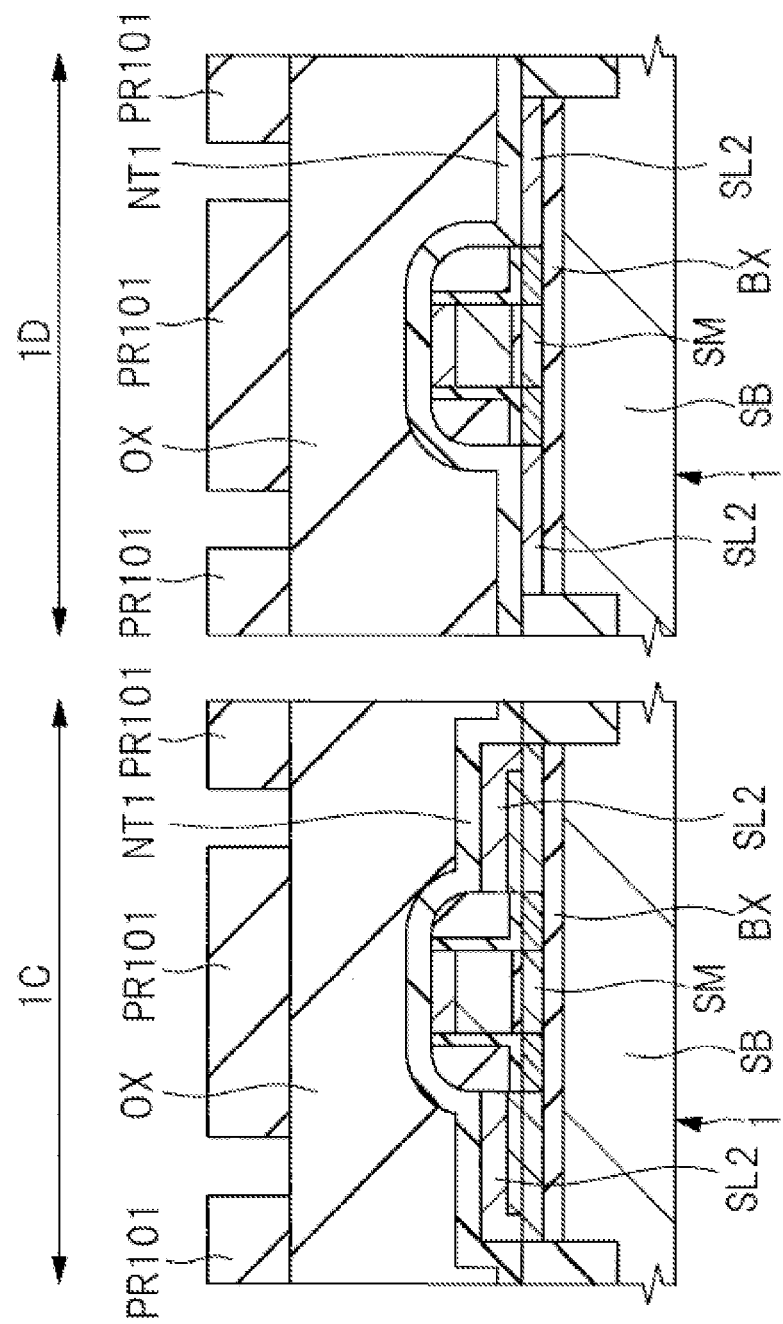
FIG. 21 is a cross-section view during a manufacturing process of a semiconductor device according to examined example.
Figure 22:
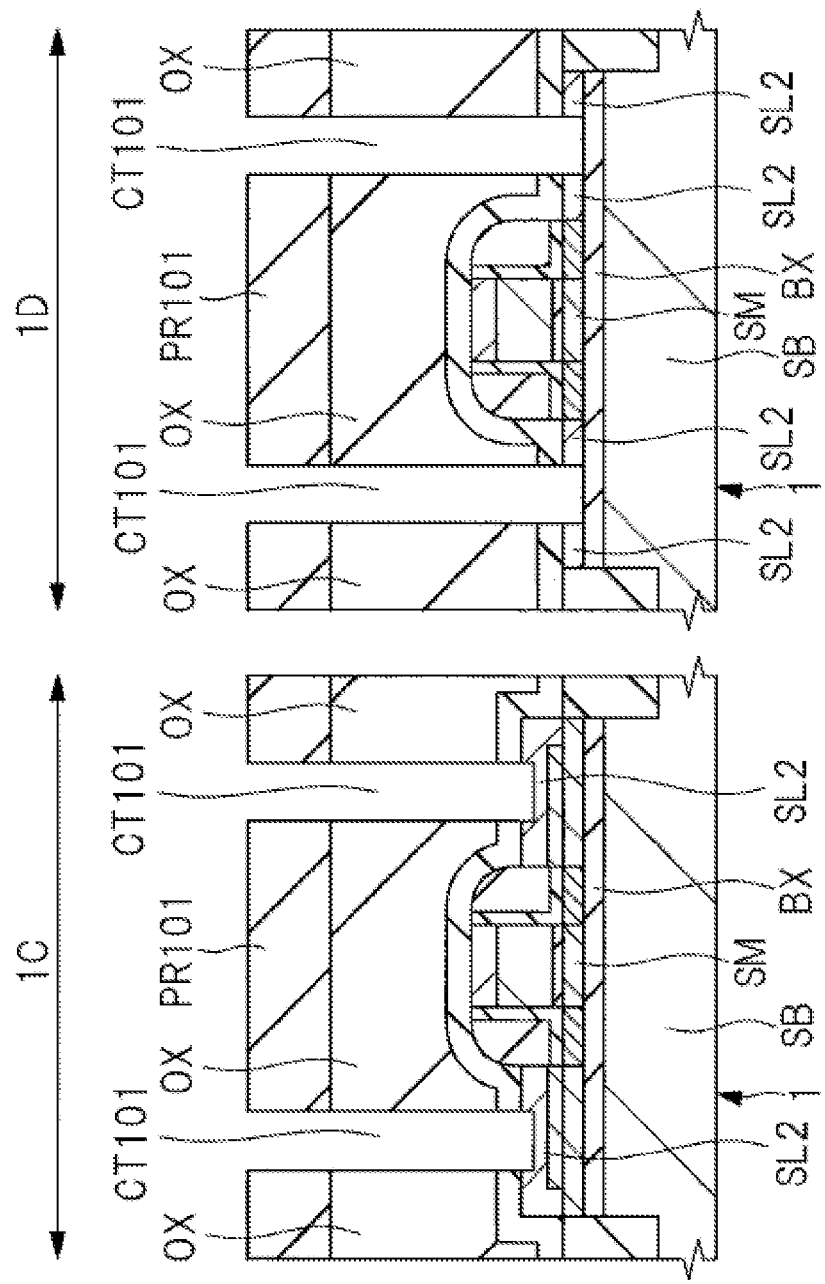
FIG. 22 is a cross-section view during the manufacturing process of the semiconductor device following FIG. 21.

After the interlayer insulating film OX is formed to obtain the structure shown in FIG. 13, as shown in FIG. 21, in examined example, a photoresist pattern PR101 is formed on the interlayer insulating film OX using a photolithography technique. The region 1C shown in FIG. 21 is a region corresponding to the region 1A of FIG. 13, and the region 1D shown in FIG. 21 is a region corresponding to the region 1B of FIG. 13. Then, as shown in FIG. 22, the interlayer insulating film OX and the insulating film NT1 are sequentially etched, preferably dry-etched, using the photoresist pattern PR101 as an etching mask, thereby forming a contact hole CT101 penetrating the interlayer insulating film OX and the insulating film NT1. At this time, first, the interlayer insulating film OX is etched under a condition that the interlayer insulating film OX is more easily etched than the insulating film NT1, and a contact hole CT101 is formed in the interlayer insulating film OX. Then, the insulating film NT1 exposed at the bottom of the contact hole CT101 is etched under a condition that the insulating film NT1 is more easily etched than the interlayer insulating film OX, thereby forming a contact hole CT101 penetrating the interlayer insulating film OX and the insulating film NT1. At the bottom of the contact hole CT101, the metal silicide layer SL2 is exposed (see region 1C in FIG. 22).

Figure 23:
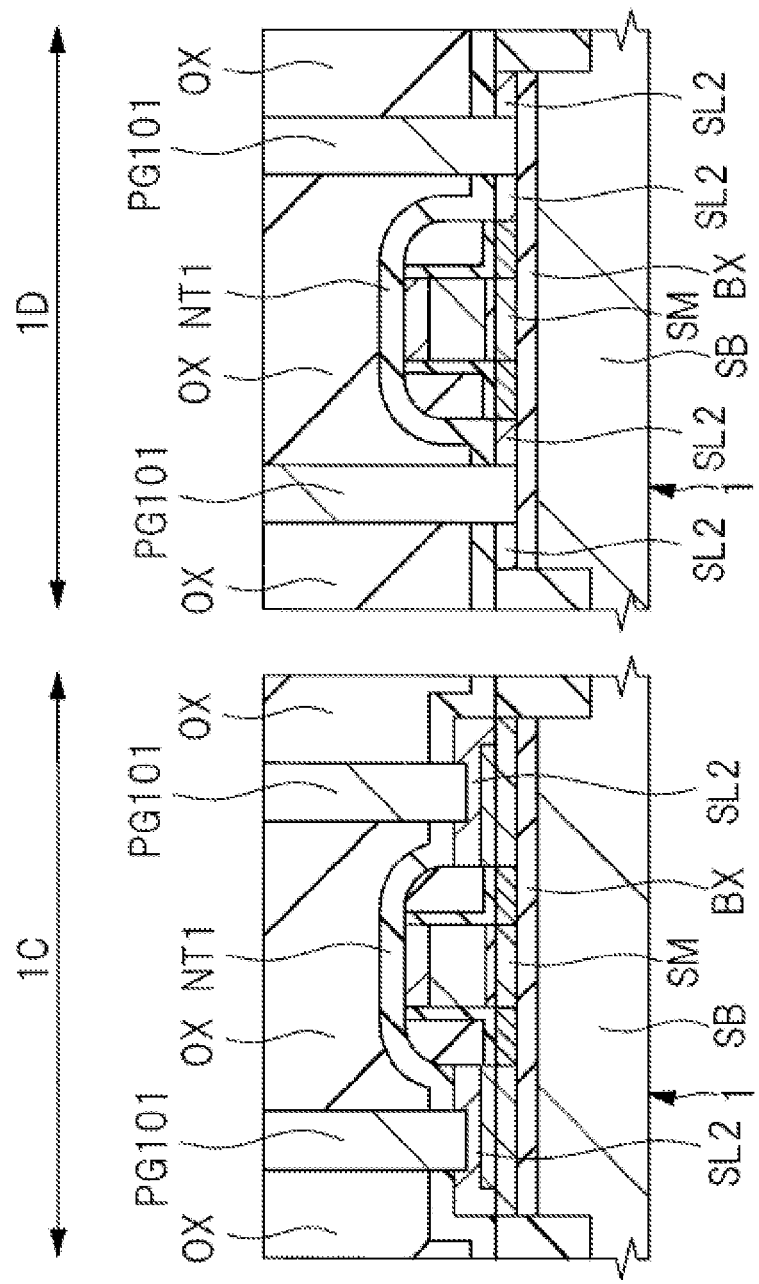
FIG. 23 is a cross-section view during the manufacturing process of the semiconductor device following FIG. 22.

Next, as shown in FIG. 23, the plug PG101 comprised of a conductive material is formed in the contact hole CT101. Since the specific method of forming the plug PG101 is similar to the method of forming the plug PG described above, the explanation thereof is omitted here.

Figure 24:
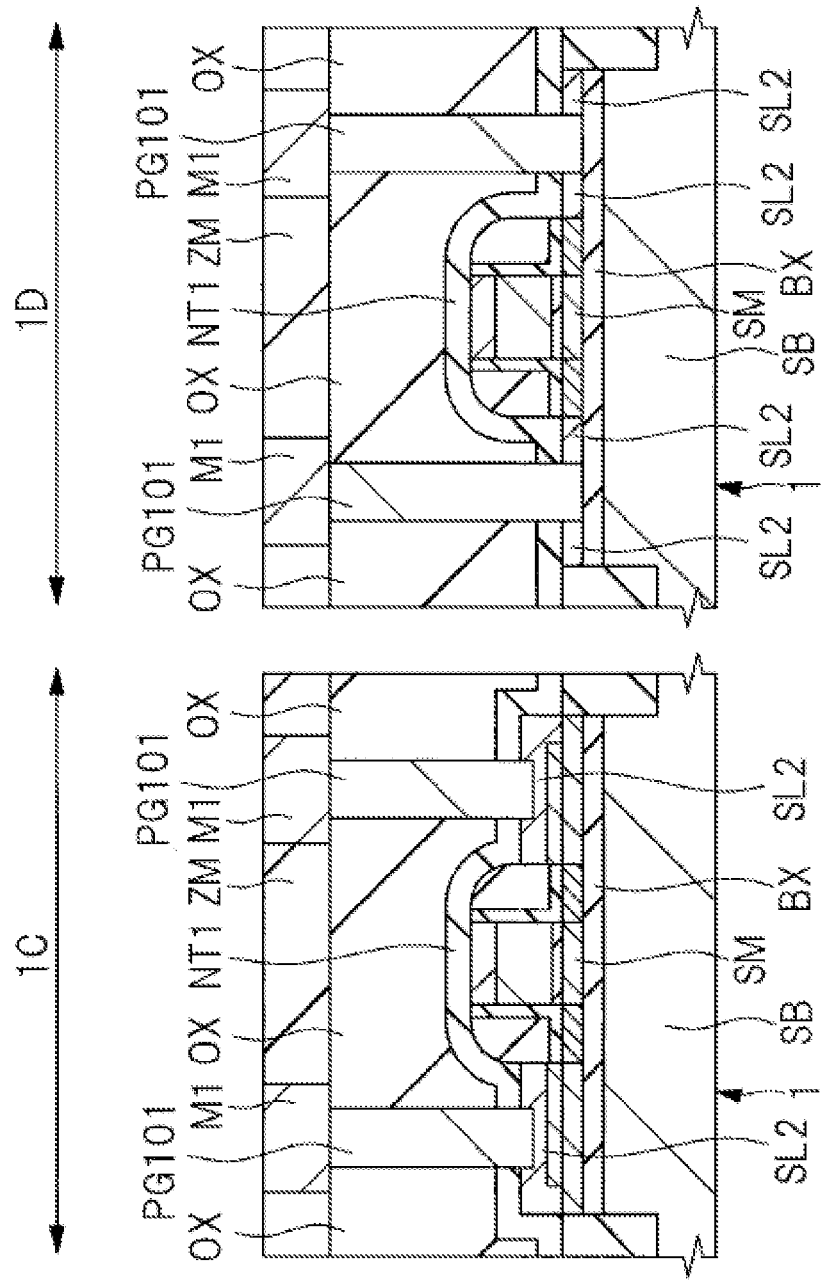
FIG. 24 is a cross-section view during the manufacturing process of the semiconductor device following FIG. 23.

Next, as shown in FIG. 24, the insulating film ZM and the interconnection M1 are also formed in examined example. Thereafter, the second and subsequent layers of wires are also formed in the case of examined example, but illustration and explanation thereof are omitted here.

In the contact hole CT101 forming step, although the metal silicide layer SL2 is originally exposed at the bottom of the contact hole CT101 as in the area 1C of FIG. 22, the etch should be terminated prior to the contact hole CT101 penetrating the metal silicide layer SL2. However, as in the area 1D of FIG. 22, the contact hole CT101 may penetrate through the metallic silicide layer SL2, and the insulating layer BX may be exposed at the bottom of the contact hole CT101. Such phenomena may occur when the thickness of the metallic silicide SL2 formed by the salicide technique becomes thinner than expected.

That is, in the region 1C, since the epitaxial layer (semiconductor layer EP) is accurately formed on the semiconductor layer SM, the thickness of the metal silicide layer SL2 is increased, and the contact hole CT101 does not penetrate through the metal silicide layer SL2 as in the region 1C of FIG. 22. On the other hand, in the region 1D, since the epitaxial layer (semiconductor layer EP) is not successfully formed on the semiconductor layer SM, the thickness of the metal silicide layer SL2 is reduced, and the contact hole CT101 penetrates through the metal silicide layer SL2 as in the region 1D of FIG. 22, and there is a possibility that the insulating layer BX is exposed at the bottom of the contact hole CT101. Therefore, when a large number of MISFET are formed, in most MISFET, the contact hole CT101 does not penetrate through the metal silicide layer SL2 as in the region 1C of FIG. 22, but in some MISFET, the contact hole CT101 penetrates through the metal silicide layer SL2 as in the region 1D of FIG. 22, and the insulating layer BX may be exposed at the bottom of the contact hole CT101. In the region 1D, part of the thickness of the insulating layer BX is also etched when the contact hole CT101 is formed, and the thickness of the insulating layer BX remaining at the bottom of the contact hole CT101 may be thinner than the thickness of the insulating layer BX in other regions.

Therefore, when the plug PG101 is formed as shown in FIG. 23, in the region 1C, the plug PG101 for the source/drain region is arranged on the metal silicide layer SL2, and the bottom surface of the plug PG for the source/drain region is in contact with upper surface of the metal silicide layer SL2, thereby electrically connecting the plug PG101 for the source/drain region and the metal silicide layer SL2. On the other hand, in the region 1D, the plug PG101 for the source/drain region penetrates through the metallic silicide layer SL2, and the lower surface of the plug PG101 for the source/drain region comes into contact with the insulating layer BX. The thickness of the insulating layer BX below the plug PG101 may be thinner than the thickness of the insulating layer BX in other regions.

If a semiconductor device is manufactured with the structure of the region 1D shown in FIG. 23, i.e., the structure in which the lower surface of the plug PG101 is in contact with the insulating layer BX, the reliability of the semiconductor device is lowered. For example, in the area 1D, if the plug PG101 and the semiconductor substrate SB face each other via the insulating layer BX and if the insulating layer BX interposed between the plug PG101 and the semiconductor substrate SB is thin, then the breakdown voltage between the plug PG101 and the semiconductor substrate SB is lowered. Therefore, leakage current between the plug PG101 and the semiconductor substrate SB may occur. In addition, if the insulating layer BX between the plug PG101 and semiconductor substrate SB breaks down during the use of semiconductor device, a short circuit occurs between the plug PG101 and semiconductor substrate SB, but a short circuit occurs between the plug PG101 and semiconductor substrate SB during the use of semiconductor device, which needs to be prevented.

Therefore, it is desired to determine whether or not the structure of the region 1D shown in FIG. 23 exists, i.e., the structure in which the lower surface of the plug PG101 is in contact with the insulating layer BX in the testing process. If it is determined in the testing process whether or not the structure of the region 1D shown in FIG. 23 (the structure in which the lower surface of the plug PG101 is in contact with the insulating layer BX) exists, and if the structure of the region 1D shown in FIG. 23 can be selected as a defective product, the structure of the region 1D does not cause a problem during use of the semiconductor device, so that the reliability of the semiconductor device can be improved.

However, it is not easy to determine whether or not the structure of the region 1D shown in FIG. 23 exists in the testing process. This is because MISFET in which the structure of the region 1D shown in FIG. 23 exists operates almost normally in the short term. In MISFET where the structure of the region 1D shown in FIG. 23 (the structure in which the lower surface of the plug PG101 is in contact with the insulating layers BX) exists, even if the plug operates normally in the short term, it is desirable to discriminate (select) the plug in the test process because a defect such as leakage or dielectric breakdown may occur in the long term, but it is difficult to discriminate (select) the plug in the test process because the plug operates almost normally in the short term. If a load test is performed in which an electric test is performed while stress is applied, it is possible to determine whether or not the structures of the region 1D shown in FIG. 23 exist, but in this case, a stress load for a long time (for example, about several minutes) is required for one semiconductor device (semiconductor chip), and the time required for the test process becomes long, and the costs required for the test process become high.

<Main Features and Effects>

In the present first embodiment, the insulating film NT1, NT3 is removed at the bottom of the opening OP by etching in step S7 to expose the metal silicide layer SL2, and then the etching step in step S8 is performed as one of the main features of the metal silicide layer OP. The etching step of step S8 is an etching step capable of selectively etching the insulating layer BX. Therefore, when the contact hole CT penetrates through the metallic silicide layer SL2 and the insulating layer BX is exposed at the bottom of the contact hole CT as in the area 1B of FIG. 17 at the stage of completing the etching of step S7, the insulating layer BX can be removed at the bottom of the contact hole CT and semiconductor substrate SB can be exposed at the bottom of the contact hole CT in the etching step of step S8. That is, when the insulating layer BX is exposed at the bottom of the contact hole CT as in the area 1B of FIG. 17 at the stage of completing the etching of step S7, the insulating layer BX at the bottom of the contact hole CT can be forcibly removed by performing the etching process of step S8.

Since it is difficult to confirm whether or not the structure of the region 1B shown in FIG. 17 exists (the structure in which the insulating layer BX is exposed at the bottom of the contact hole CT) in the respective SOI substrate 1 at the stage of completing the etching of step S7, the etching step of step S8 is performed in the present first embodiment regardless of whether or not the structure of the region 1B shown in FIG. 17 exists at the stage of completing the etching of step S7. Therefore, when the structure of the region 1B of FIG. 17 exists even at the stage of completing the etching of step S7, the portion inevitably becomes the structure of the region 1B of FIG. 18 (structure in which semiconductor substrate SB is exposed at the bottom of the contact hole CT) when the etching step of step S8 is performed.

Therefore, when the plug PG is formed, in the region 1A, the plug PG for the source/drain region does not penetrate through the metal silicide layer SL2 and is not conductive with semiconductor substrate SB, but in the region 1B, the plug PG for the source/drain region penetrates through the metal silicide layer SL2 and the insulating layer BX and is conductive with semiconductor substrate SB. It is easy to determine whether or not the plug PG for the source/drain region is electrically connected with the semiconductor substrate SB in the test process (e.g., probe test). For example, if an electric potential difference is provided between the plug PG for the source/drain region and semiconductor substrate SB to check whether or not a current flows between the plug PG for the source/drain region and semiconductor substrate SB, it is possible to determine whether or not the plug PG for the source/drain region is electrically connected to semiconductor substrate SB. Therefore, tests for determining whether or not the plug PG for the source/drain region is electrically connected with the semiconductor substrate SB can be performed easily and in a short time.

In MISFET where the structure of the regions 1D shown in FIG. 24 is present, even if they operate normally in the short term, they are desired to be discriminated in the test process because defects such as leakage or dielectric breakdown may occur in the long term, but they are difficult to be discriminated in the test process because they operate almost normally in the short term. On the other hand, in the present first embodiment, when the insulating layer BX is exposed at the bottom of the contact hole CT as in the region 1B of FIG. 17 by the etching of step S7, the insulating layer BX is forcibly removed at the bottom of the contact hole CT as in the region 1B of FIG. 18 by the etching step of step S8, and the contact hole CT is forcibly made to reach semiconductor substrate SB.

As a result, since the plug PG formed in the contact hole CT of the region 1B inevitably comes into contact with semiconductor substrate SB, if it is determined whether or not the plug PG and semiconductor substrate SB are conductive, it is possible to determine whether or not a portion having the structure of the region 1B in FIG. 19 (a structure in which the plug PG contacts semiconductor substrate SB) exists. Therefore, in the test process (for example, the probe test), it is possible to easily and quickly determine whether or not there is a portion having the structure of the region 1B in FIG. 19 (the structure in which the plug PG is in contact with semiconductor substrate SB), so that the time required for the test process can be shortened and the costs required for the test process can be reduced. Further, it is possible to prevent the plug for the source/drain region from contacting the insulating layer BX as in the region 1D of FIG. 23, and to prevent a portion facing semiconductor substrate SB from being generated through the insulating layer BX. Therefore, the reliability of a semiconductor device can be improved.

In addition, as another one of the main features of the present first embodiment, the step S8 is performed while upper surface of the interlayer insulating film OX is covered with the insulating film NT2 and the side surface of the opening OP of the interlayer insulating film OX is covered with the insulating film NT3. The etching step of step S8 is performed under a condition that the insulating film NT2 and the insulating film NT3 are hardly etched as compared with the insulating film BX. Therefore, in the etching step of step S8, it is possible to suppress or prevent the interlayer insulating film OX from being etched while allowing the insulating layer BX to be etched. As a result, variations in the shapes of the contact holes CT caused by the etching of the interlayer insulating film OX and a decrease in upper surface flatness of the interlayer insulating film OX can be prevented, so that it is possible to prevent a problem from occurring when the plug PG is formed later or when the wires M1 are formed later. Therefore, the reliability of a semiconductor device can be improved.

In particular, when the insulating layer BX and the interlayer insulating film OX are made of the same material, preferably silicon oxide, if the insulating film NT3 on the side surface of the opening OP of the interlayer insulating film OX and the insulating film NT2 on upper surface of the interlayer insulating film OX do not exist, the interlayer insulating film OX is also etched considerably when the insulating layer BX is removed in the etching step of step S8. In the present first embodiment, even when the insulating layer BX and the interlayer insulating film OX are made of the same material, preferably silicon oxide, the insulating layer BX can be selectively etched while suppressing or preventing the etching of the interlayer insulating film OX in the etching step S8.

Second Embodiment

A manufacturing process of a semiconductor device of the present second embodiment will be described referring to FIGS. 25 to 28.

Figure 25:
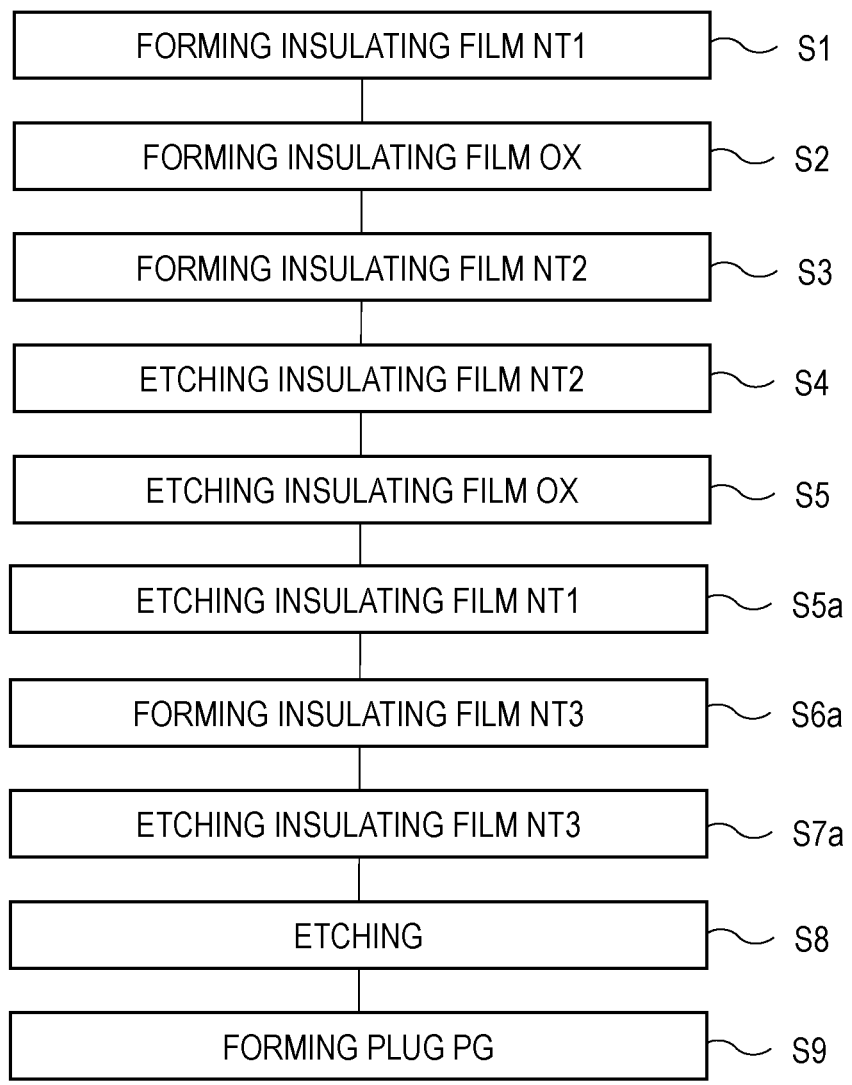
FIG. 25 is a process flow diagram showing a part of a manufacturing process of a semiconductor device according to another embodiment.
Figure 26:
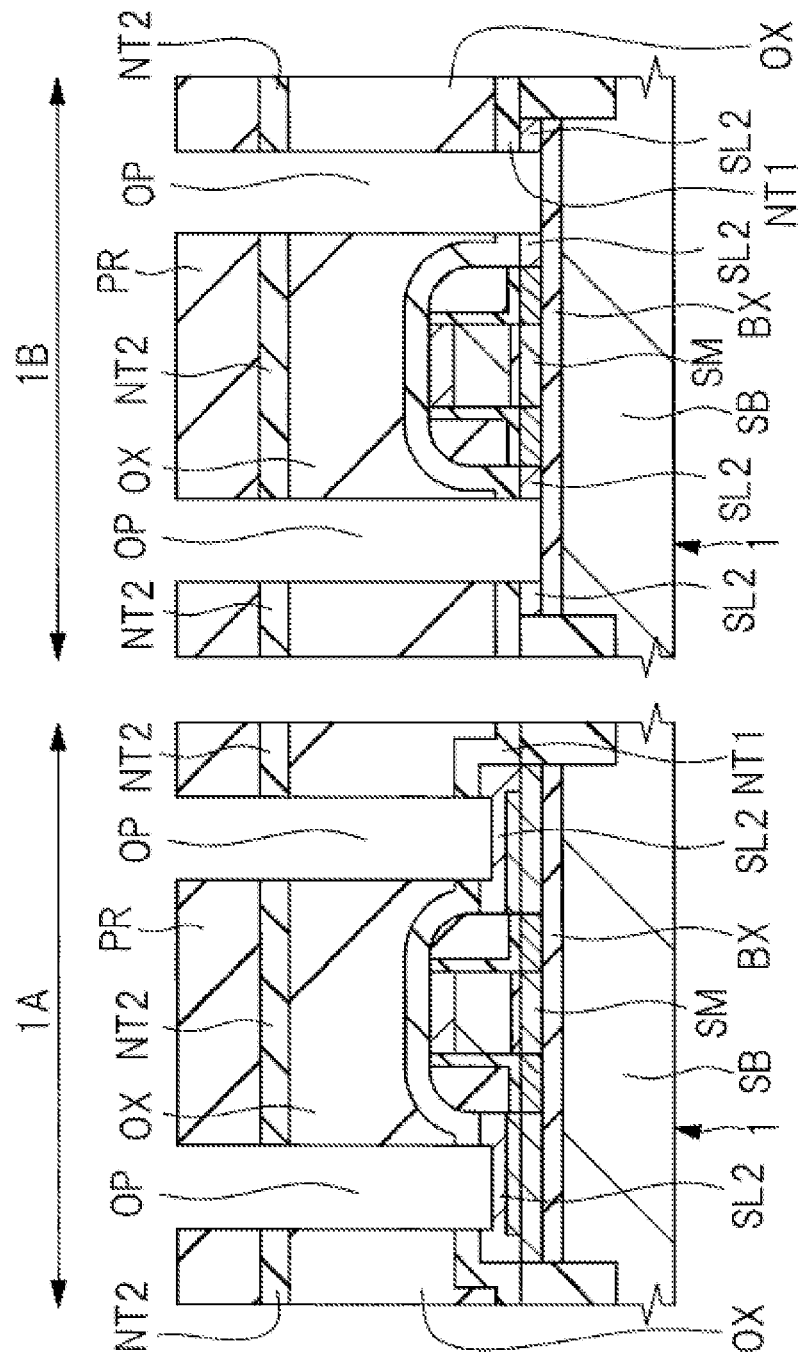
FIG. 26 is a cross-section view during the manufacturing process of the semiconductor device according to another embodiment.
Figure 27:
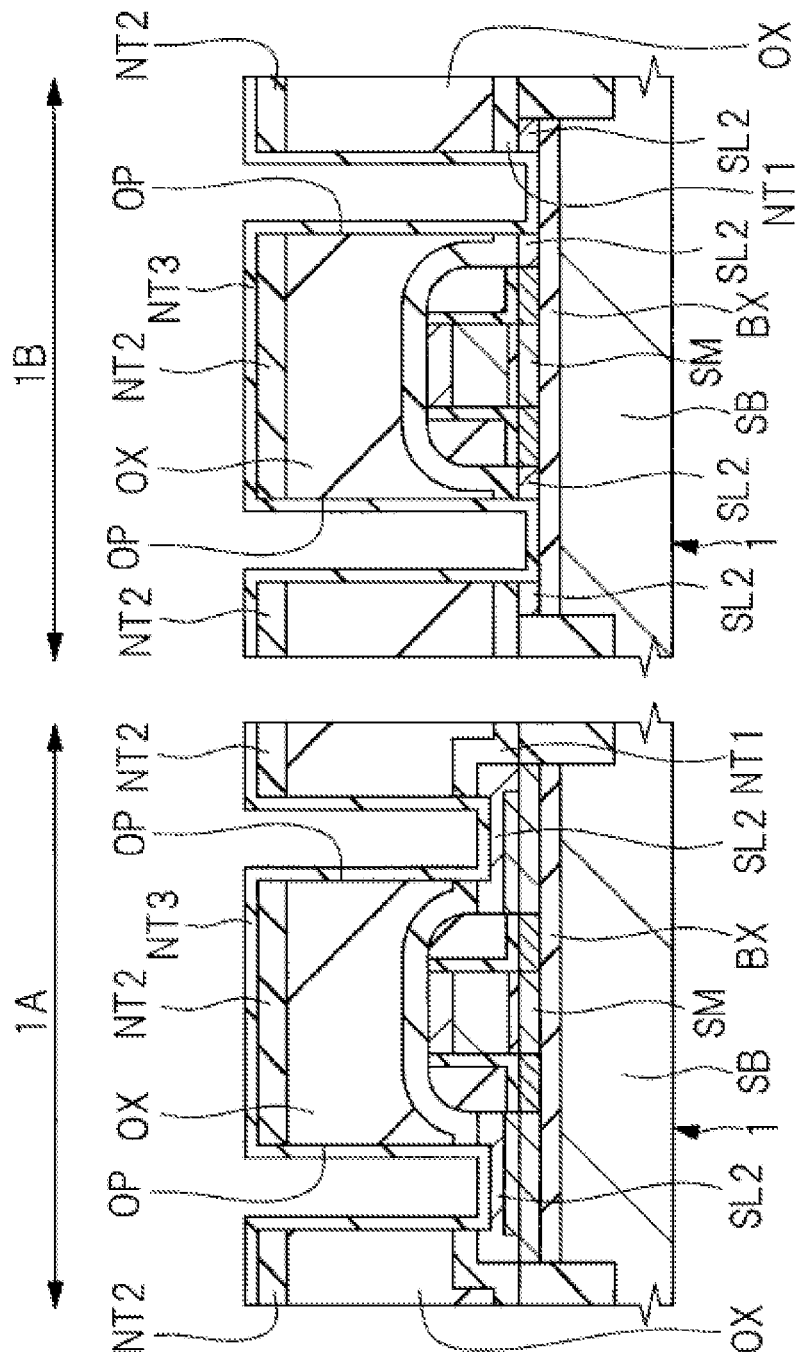
FIG. 27 is a cross-section view during the manufacturing process of the semiconductor device following FIG. 26.
Figure 28:
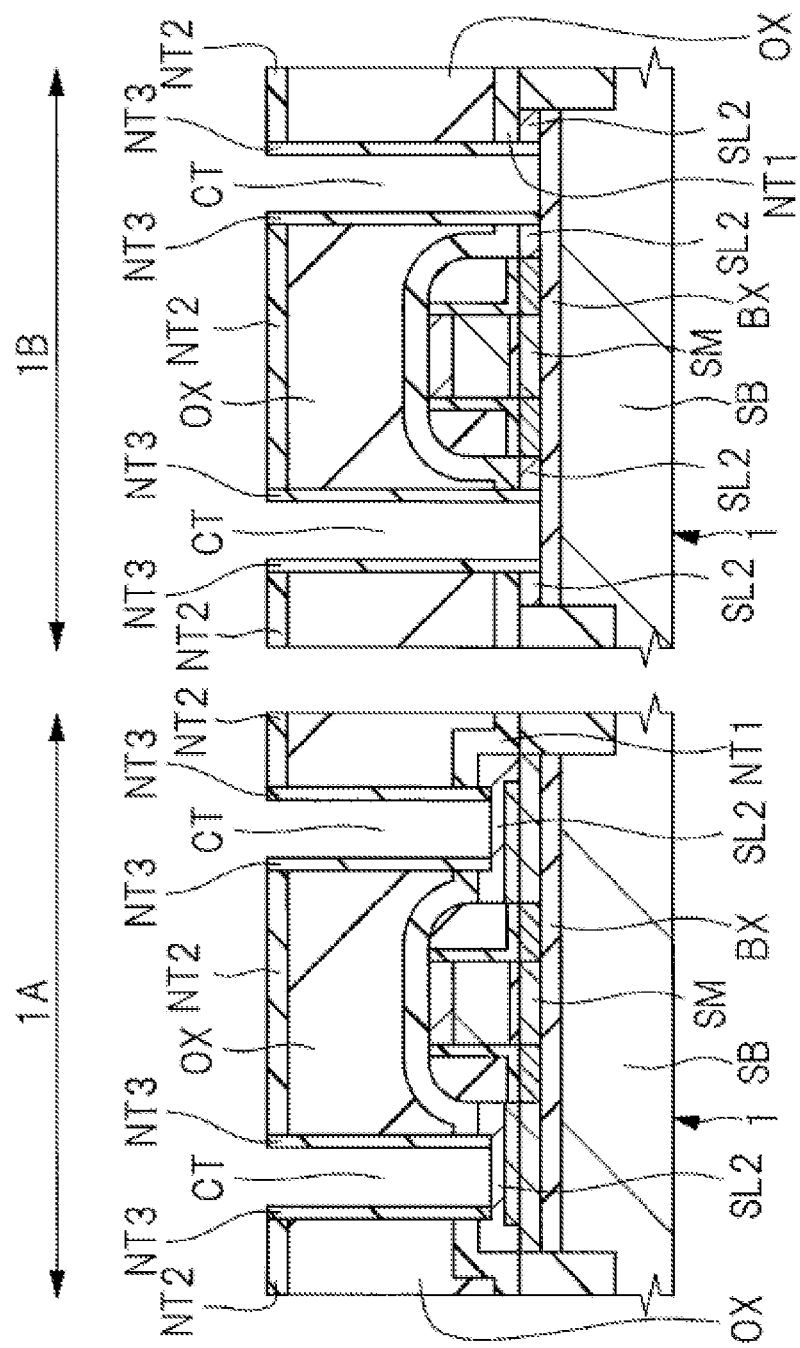
FIG. 28 is a cross-section view during the manufacturing process of the semiconductor device following FIG. 27.

FIG. 25 is a process flow diagram showing a part of a manufacturing process of a semiconductor device according to the present second embodiment and corresponds to FIG. 1. FIGS. 26 to 28 are a cross-section view during the manufacturing process of the semiconductor device according to the present second embodiment.

Until the structure shown in FIG. 15 is obtained, the manufacturing process of semiconductor device of present second embodiment is substantially the same as that of the above-mentioned first embodiment (steps shown in FIGS. 2 to 14), and therefore the repetitive explanation thereof is omitted here.

After the structure of FIG. 14 is obtained, in the above first embodiment, the insulating film NT2 and the interlayer insulating film OX are sequentially etched using the photoresist pattern PR as an etching mask to form an opening OP penetrating the insulating film NT2 and the interlayer insulating film OX, and the etching is completed in a step in which the insulating film NT1 is exposed at the bottom of the opening OP, that is, in a stage in which the structure of FIG. 15 is obtained. Thereafter, an insulating film NT3 is formed as shown in FIG. 16.

On the other hand, in the present second embodiment, after the structure shown in FIG. 15 is obtained in the same manner as the structure shown in the above first embodiment, as shown in FIG. 26, the insulating film NT1 exposed at the bottom of the opening OP is removed by etching using the photoresist pattern PR as an etching mask (step S5a in FIG. 25). That is, in present second embodiment, the etching in step S4, the etching in step S5, and the etching in step S5*a* are performed in this order, whereby the opening OP penetrates through the insulating films NT2, OX, and NT1, and the metal silicide layer SL2 is exposed at the bottom of the opening OP (see region 1A in FIG. 22). The etching in step S5*a* is performed under a condition that the insulating film NT1 is more easily etched than the metal silicide layer SL (SL2), the interlayer insulating film OX, and the insulating layer BX. The etching in step S5*a* is preferably dry etching, and anisotropic dry etching is particularly preferable. Thereafter, the photoresist pattern PR is removed by asking or the like.

Here, although the metal silicide layer SL2 is originally exposed at the bottom of the opening OP as in the area 1A of FIG. 26, the etching in S5*a* should be terminated prior to the opening OP penetrating the metal silicide layer SL2. However, the insulating film NT1 is not only removed at the bottom of the opening OP but also the metal silicide layer SL is etched and removed by the etching in step S5*a* as in the area 1B of FIG. 26, and the opening OP may penetrate through the metal silicide layer SL2 and the insulating layer BX may be exposed at the bottom of the opening OP. The reason for this is the same as that when the contact hole CT101 penetrates through the metallic silicide layer SL2 in the region 1D of FIG. 22 and the insulating layer BX is exposed at the bottom of the contact hole CT101 in the above examined example. Similar to the above first embodiment, also in the present second embodiment, there is a possibility that a portion having the structure of the region 1A and a portion having the structure of the region 1B are mixed.

Next, as shown in FIG. 27, an insulating film NT3 is formed on the insulating film NT2 including the bottom surface and the side surface of the opening OP in step S6*a* of FIG. 25. This second embodiment is also the same as first embodiment described above with respect to the method of forming the insulating film NT3, the materials constituting the insulating film NT3, the thickness of the insulating film NT3, and the like. On upper surface of the interlayer insulating film OX, a laminated film of the insulating film NT2 and the insulating film NT3 thereon is formed, and on the side surface of the opening OP of the interlayer insulating film OX, an insulating film NT3 is formed. Further, in the area 1A, since the insulating film NT3 is formed in a state in which the metal silicide layer SL2 is exposed at the bottom of the opening OP, the insulating film NT3 is formed on the metal silicide layer SL2 at the bottom of the opening OP. Further, in the area 1B, since the insulating film NT3 is formed in a state in which the insulating layer BX is exposed at the bottom of the opening OP, the insulating film NT3 is formed on the insulating layer BX at the bottom of the opening OP.

Next, in operation S7*a* of FIG. 25, the insulating film NT3 at the bottom of the opening OP is etched away. In the region 1A, the insulating film NT3 at the bottom of the opening OP is removed and the metallic silicide SL2 is exposed at the bottom of the opening OP. In addition, in the region 1B, the insulating film NT3 at the bottom of the opening OP is removed and the insulating film BX is exposed at the bottom of the opening OP. As a result, the contact hole CT is formed. The contact hole CT is formed of the opening OP, and the inner wall (side surface) of the contact hole CT is formed by the side surface of the insulating film NT3 remaining in a layered manner on the side surface of the opening OP. Therefore, the radius of the contact hole CT is smaller than the radius of the opening OP by the thickness of the insulating film NT3 remaining in a layered manner on the side surface of the opening OP. The etching in S7*a* is performed under a condition that the metal silicide layer SL (SL2) and the insulating layer BX are harder to be etched than the insulating film NT3.

The etching in step S7*a* is preferably dry etching, and anisotropic dry etching is particularly preferable. Therefore, the insulating film NT3 remains in the form of a layer on the side surface of the opening OP of the interlayer insulating film OX at the stage when the etch of step S7*a* is completed. Further, as the insulating film NT3 at the bottom of the opening OP is removed by the etching in step S7*a*, the insulating film NT3 of the insulating film NT2,NT3 on upper surface of the interlayer insulating film OX is also removed by the etching in step S7*a*. However, it is preferable that the thickness of the insulating film NT3 to be formed in step S6 is set so that the insulating film NT3 remains in a layered manner on upper surface of the interlayer insulating film OX at the stage when the etch in step S7*a* is completed.

Therefore, when the step S7*a* is etched, in the region 1A of FIG. 28, the insulating film NT1 is removed at the bottom of the opening OP to expose the metal silicide layer SL, the insulating film NT3 remains in a layered state on the side surface of the opening OP of the interlayer insulating film OX, and the insulating film NT2 remains in a layered state on upper surface of the interlayer insulating film OX. In addition, when the step S7*a* is etched, in the region 1B of FIG. 28, the insulating film NT1 is removed at the bottom of the opening OP to expose the insulating layer BX, the insulating film NT3 remains in a layered state on the side surface of the opening OP of the interlayer insulating film OX, and the insulating film NT2 remains in a layered state on upper surface of the interlayer insulating film OX. In any of the regions 1A, 1B of FIG. 28, since the side surface of the opening OP of the interlayer insulating film OX is covered with the insulating film NT3 and upper surface of the interlayer insulating film OX is covered with the insulating film NT2, it is possible to prevent the interlayer insulating film OX from being exposed at the stage when the etch of S7*a* is completed.

In the case of the present second embodiment, the thickness of the insulating film NT2 formed in step S3 can be reduced as compared with the case of the above-mentioned first embodiment. In any case, in the first embodiment as well as the second embodiment, the upper surface of the interlayer insulating film OX is covered with the insulating film NT2 at the stage of completing the etching of S7.

The structure of FIG. 28 in the present second embodiment is similar to the structure of FIG. 17 in the above first embodiment. That is, the structure of the region 1A in FIG. 28 is similar to the structure of the region 1A in FIG. 17, and the structure of the region 1B in FIG. 28 is similar to the structure of the region 1B in FIG. 17. Therefore, in the present second embodiment, the process after the step S7*a* is etched to obtain the structure of FIG. 28 is the same as the etching process of the step S8 and the subsequent steps (i.e., the steps of FIGS. 18 to 20) in the above first embodiment, but the repetitive explanation thereof is omitted here.

In the present second embodiment, substantially the same effects as those of the above-mentioned first embodiment can be obtained. However, in the present second embodiment, the insulating film NT1 at the bottom of the opening OP is removed by the etching in step S5*a*, then the insulating film NT3 forming step is performed, and then the insulating film NT3 at the bottom of the opening OP is removed by the etching in step S7*a*, whereas in the above first embodiment, after the insulating film NT3 forming step is performed, the insulating films NT3 and NT1 at the bottom of the opening OP are removed by the etching in step S7. Therefore, the first embodiment can reduce the number of steps and shorten the manufacturing time of a semiconductor device compared with the present second embodiment.

The invention made by the present inventor has been described above in detail based on the embodiment, but the present invention is not limited to the above embodiments, and it is needless to say that various modifications can be made without departing from the gist thereof.

What is claimed is:

1. A method of manufacturing a semiconductor device, comprising the steps of:
    (a) providing a substrate including a semiconductor substrate, an insulating layer formed on the semiconductor substrate, a semiconductor layer formed on the insulating layer, and a gate electrode formed on the semiconductor layer via a gate insulating film;
    (b) after the step (a), forming an epitaxial layer on the semiconductor layer located at both sides of the gate electrode by an epitaxial growth method;
    (c) after the step (b), forming a metal silicide layer in the epitaxial layer by silicidation of the epitaxial layer;
    (d) after the step (c), forming an interlayer insulating film on the substrate so as to cover the gate electrode and the metal silicide layer;
    (e) after the step (d), forming a first insulating film on the interlayer insulating film;
    (f) after the step (e), forming an opening at a portion of each of the first insulating film and the interlayer insulating film, which is overlapping with the metal silicide layer;
    (g) after the step (f), forming a second insulating film at each of a bottom portion of the opening and a side surface of the opening, and on an upper surface of the first insulating film;
    (h) after the step (g), removing each of the second insulating film formed at the bottom portion of the opening and the second insulating film formed on the upper surface of the first insulating film by etching;
    (i) after the step (h), etching inside of the opening in such a state that an upper surface of the interlayer insulating film is covered with the first insulating film, and in such a state that the side surface of the opening, which is a side surface of the interlayer insulating film, is covered with the second insulating film; and
    (j) after the step (i), forming a plug comprised of a conductive material inside of the opening,
    wherein the step (i) is performed under a condition that each of the first insulating film, the second insulating film and the metal silicide layer is less etched than the insulating layer.

2. The method according to claim 1, wherein the step (i) is performed under a condition that each of the first insulating film and the second insulating film is less etched than the interlayer insulating film.

3. The method according to claim 2, wherein the step (i) is performed by one of wet etching using hydrofluoric acid and dry etching using fluorocarbon.

4. The method according to claim 3,
    wherein the insulating layer is consisted of a first thickness,
    wherein the first thickness is equal to 10 nm or more, and equal to 30 nm or less, and
    wherein the step (i) is performed under a condition that at least the first thickness of the insulating layer is etched.

5. The method according to claim 1, wherein the insulating layer and the interlayer insulating film are comprised of the same material to each other.

6. The method according to claim 5, wherein each of the insulating layer and the interlayer insulating film is made of silicon oxide.

7. The method according to claim 1, wherein the first insulating film and the second insulating film are comprised of the same material to each other.

8. The method according to claim 7, wherein each of the first insulating film and the second insulating film is made of silicon nitride.

9. The method according to claim 1, wherein the step (i) is performed by anisotropic dry etching.

10. The method according to claim 1,
    wherein, if the insulating layer is not exposed at the bottom portion of the opening by the step (h), the insulating layer located beneath the opening is not etched by the step (i), and
    wherein, if the insulating layer is exposed at the bottom portion of the opening by the step (h), the insulating layer located beneath the opening is etched by the step (i), thereby the semiconductor substrate is exposed.

11. The method according to claim 1, further comprising the step of:
    (d1) after the step (c) and before the step (d), forming a third insulating film on the substrate so as to cover the gate electrode and the metal silicide layer,
    wherein in the step (d), the interlayer insulating film is formed on the third insulating film,
    wherein in the step (f), the opening is formed such that the opening penetrates through the first insulating film and the interlayer insulating film, and such that the third insulating film is remained at the bottom portion of the opening, and
    wherein in the step (h), each of the second insulating film formed at the bottom portion of the opening, the third insulating film formed at the bottom portion of the opening, and the second insulating film formed on the upper surface of the first insulating film is removed by etching.

12. The method according to claim 11, wherein the first insulating film, the second insulating film and the third insulating film are comprised of the same material to one another.

13. The method according to claim 11, wherein each of the first insulating film, the second insulating film and the third insulating film is made of silicon nitride.

14. The method according to claim 1, further comprising the step of:
    (d1) after the step (c) and before the step (d), forming a third insulating film on the substrate so as to cover the gate electrode and the metal silicide layer,
    wherein in the step (d), the interlayer insulating film is formed on the third insulating film, and
    wherein in the step (f), the opening is formed such that the opening penetrates through the first insulating film, the interlayer insulating film and the third insulating film.

15. The method according to claim 1, further comprising the step of:
    (b1) after the step (b) and before the step (c), forming a source region in each of the epitaxial layer and the semiconductor layer located at one side of the gate electrode, and forming a drain region in each of the epitaxial layer and the semiconductor layer located at the other side of the gate electrode.

\* \* \* \* \*